US012563738B2

(12) United States Patent
Ha et al.

(10) Patent No.: US 12,563,738 B2
(45) Date of Patent: Feb. 24, 2026

(54) SEMICONDUCTOR DEVICES

(71) Applicant: Samsung Electronics Co., Ltd.,
Suwon-si (KR)

(72) Inventors: Daewon Ha, Seoul (KR); Kyunghwan Lee, Seoul (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 374 days.

(21) Appl. No.: 18/069,398

(22) Filed: Dec. 21, 2022

(65) Prior Publication Data

US 2023/0276634 A1     Aug. 31, 2023

(30) Foreign Application Priority Data

Feb. 28, 2022     (KR) ......................... 10-2022-0026255
Apr. 7, 2022     (KR) ......................... 10-2022-0043530

(51) Int. Cl.
*H10B 51/30* (2023.01)
*G11C 11/22* (2006.01)
(Continued)

(52) U.S. Cl.
CPC .......... *H10B 51/30* (2023.02); *G11C 11/2275* (2013.01); *H10B 51/40* (2023.02); *H10D 64/689* (2025.01)

(58) Field of Classification Search
CPC ...... H10B 51/30; H10B 51/40; H10D 64/689; G11C 11/2275
See application file for complete search history.

(56) References Cited

U.S. PATENT DOCUMENTS 8,987,832 B2 *   3/2015  Park ...................... H10B 63/84
                                                       257/390
10,847,424 B2   11/2020  Tapily et al.
(Continued)

FOREIGN PATENT DOCUMENTS

KR     10-2015-0144818 A     12/2015
KR     10-2019-0008048 A      1/2019
(Continued)

OTHER PUBLICATIONS

Han Joon Kim et al., "Grain size engineering for ferroelectric Hf0.5Zr0.5O2 films by an insertion of Al2O3 interlayer" *Applied Physics Letters* 105, 192903 (2014).
(Continued)

*Primary Examiner* — Richard A Booth
(74) *Attorney, Agent, or Firm* — Fish & Richardson P.C.

(57) ABSTRACT

A semiconductor device includes a substrate including an active region extending in a first direction, a gate electrode on the substrate and extending in a second direction, and a plurality of channel layers on the active region. The plurality of channel layers are spaced apart from each other in a third direction perpendicular to an upper surface of the substrate. The device includes a plurality of dielectric layers between the plurality of channel layers and the gate electrode, the plurality of dielectric layers include at least one of a ferroelectric material or an anti-ferroelectric material, and each of the plurality of dielectric layers has a different coercive voltage. The device includes source/drain regions in recess regions in which the active region is recessed, the source/drain regions are on both sides of the gate electrode, and the source/drain regions are in contact with the plurality of channel layers.

20 Claims, 15 Drawing Sheets

(51) Int. Cl.
   *H10B 51/40*        (2023.01)
   *H10D 64/68*        (2025.01)

(56)                      References Cited

U.S. PATENT DOCUMENTS

| | | | |
|---|---|---|---|
| 10,879,394 | B2 | 12/2020 | Yeh et al. |
| 11,107,886 | B2 | 8/2021 | Chang et al. |
| 11,177,259 | B2 | 11/2021 | Cheng et al. |
| 12,225,732 | B2 * | 2/2025 | Müller .................. H10B 51/30 |
| 2019/0019800 | A1 | 1/2019 | Yoo et al. |
| 2021/0296445 | A1 | 9/2021 | Lee et al. |
| 2021/0375683 | A1 | 12/2021 | Lin et al. |

FOREIGN PATENT DOCUMENTS

| | | |
|---|---|---|
| KR | 10-20190036773 A | 4/2019 |
| KR | 10-2020-0086606 A | 7/2020 |
| KR | 10-2020-0135662 A | 12/2020 |

OTHER PUBLICATIONS

Fei Mo et al., "Low-Voltage Operating Ferroelectric FET with Ultrathin IGZO Channel for High-Density Memory Application" *Journal of The Electron Devices Society* vol. 8, 2020.
Mengwei Si et al., "The Impact of Channel Semiconductor on the Memory Characteristics of Ferroelectric Field-Effect Transistors" *Journal of The Electron Devices Society* vol. 8, 2020.
Notice of Allowance in Korean Appln. No. 10-2022-0043530, mailed on Jan. 14, 2026, 6 pages (with English translation).

* cited by examiner

A

A

A

100c

100d

100e

100f

SEMICONDUCTOR DEVICES

CROSS-REFERENCE TO RELATED APPLICATIONS

This application claims the benefit under 35 U.S.C. § 119(a) of Korean Patent Application No. 10-2022-0026255 filed on Feb. 28, 2022 and Korean Patent Application No. 10-2022-0043530 filed on Apr. 7, 2022 in the Korean Intellectual Property Office, the entire disclosures of which are incorporated herein by reference.

FIELD

The present inventive concept relates to a semiconductor device.

BACKGROUND

Ferroelectrics are materials having ferroelectricity that maintains spontaneous polarization by aligning internal electric dipole moments even when no external electric field is applied. Research has been conducted to apply such ferroelectric properties to memory elements of semiconductor devices.

SUMMARY

Some example embodiments provide a semiconductor device having improved integration and electrical characteristics.

According to some example embodiments, a semiconductor device includes a substrate including an active region extending in a first direction, a gate electrode on the substrate, the gate electrode extending in a second direction and intersecting the active region, and a plurality of channel layers on the active region, the plurality of channel layers spaced apart from each other in a third direction, the third direction perpendicular to an upper surface of the substrate, and the plurality of channel layers surrounded by the gate electrode. The device includes a plurality of dielectric layers between the plurality of channel layers and the gate electrode, the plurality of dielectric layers including at least one of a ferroelectric material or an anti-ferroelectric material, and each of the plurality of dielectric layers having a different coercive voltage, and source/drain regions in recess regions in which the active region is recessed, the source/drain regions on both sides of the gate electrode, and the source/drain regions in contact with the plurality of channel layers.

According to some example embodiments, a semiconductor device includes a substrate including an active region extending in a first direction, a gate electrode on the substrate, the gate electrode extending in a second direction and intersecting the active region, and a first channel layer, a second channel layer, and a third channel layer spaced apart from each other in a third direction, the third direction perpendicular to an upper surface of the substrate, wherein the first channel layer, the second channel layer and the third channel layer are sequentially stacked on the active region, and wherein the first channel layer, the second channel layer and the third channel layer are surrounded by the gate electrode. The device includes a first dielectric layer surrounding the first channel layer, a second dielectric layer surrounding the second channel layer, and a third dielectric layer surrounding the third channel layer, wherein the first dielectric layer, the second dielectric layer and the third dielectric layer are sequentially stacked in the third direction on the active region, wherein the first dielectric layer, the second dielectric layer and the third dielectric layer include at least one of a ferroelectric material or an anti-ferroelectric material, and wherein each of the first dielectric layer, the second dielectric layer and the third dielectric layer has a different thickness. The device includes source/drain regions in recess regions in which the active region is recessed, the source/drain regions on both sides of the gate electrode, and the source/drain regions in contact with the first channel layer, the second channel layer and the third channel layer.

According to some example embodiments, a semiconductor device includes a memory cell array including a plurality of memory elements, and a peripheral circuit region including peripheral circuits configured to control the memory cell array. Each of the plurality of memory elements includes an active region extending in a first direction, a gate electrode intersecting the active region, the gate electrode extending in a second direction, a plurality of channel layers on the active region, the plurality of channel layers spaced apart from each other in a third direction, the third direction perpendicular to an upper surface of the active region, and the plurality of channel layers surrounded by the gate electrode, and a plurality of dielectric layers between the plurality of channel layers and the gate electrode, the plurality of dielectric layers including at least one of a ferroelectric material or an anti-ferroelectric material. In each of the plurality of memory elements, a number of the plurality of channel layers is N, where N is a natural number equal to or greater than 2, and each of the plurality of memory elements is configured to store N bits of data or less.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
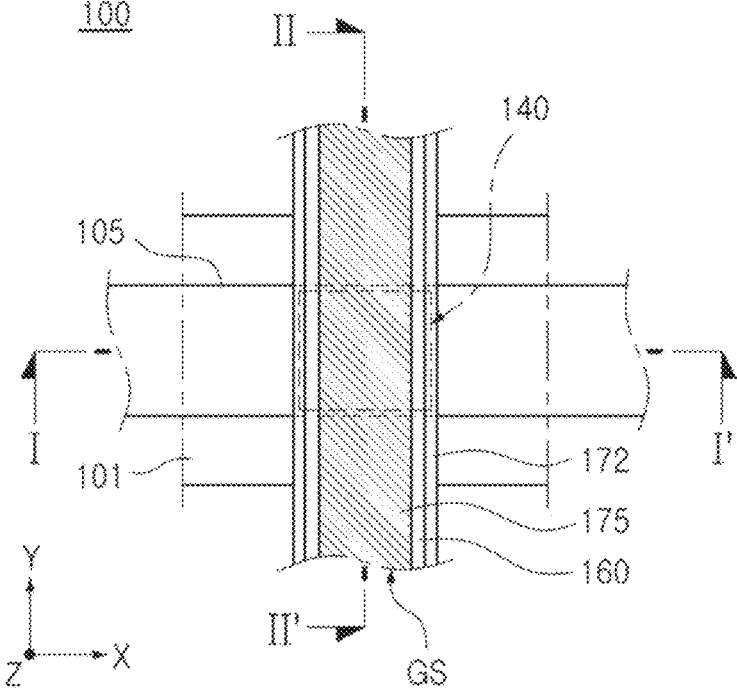
FIG. 1 is a plan view illustrating a semiconductor device according to some example embodiments.

Hereinafter, some example embodiments of the present inventive concepts will be described with reference to the accompanying drawings. Hereinafter, with the exception of cases indicated by reference numerals, terms such as 'on,' 'upper portion,' 'upper surface,' 'below,' 'lower portion,' 'lower surface,' 'side surface' and the like may be understood as being referred based on the drawings.

FIG. 1 is a plan view illustrating a semiconductor device according to some example embodiments.

Figure 2:
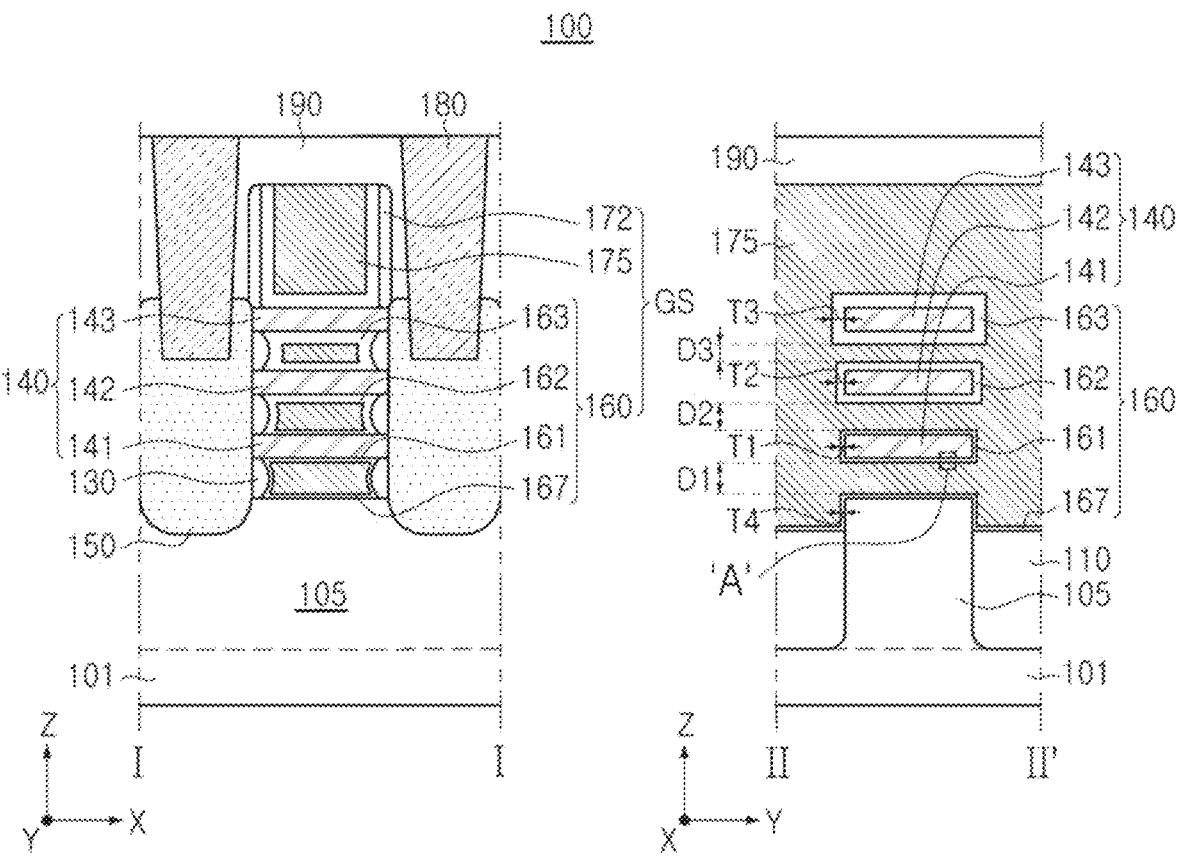
FIG. 2 is a cross-sectional view illustrating a semiconductor device according to some example embodiments.

FIG. 2 is a cross-sectional view illustrating a semiconductor device according to some example embodiments. FIG. 2 illustrates cross-sections of the semiconductor device of FIG. 1 taken along lines I-I' and II-II'. For convenience of description, only some components of the semiconductor device are illustrated in FIG. 1.

Referring to FIGS. 1 and 2, a semiconductor device 100 may include a substrate 101 including an active region 105, a channel structure 140 including first to third channel layers 141, 142 and 143 vertically spaced apart from each other on the active region 105, a gate structure GS extending intersecting the active region 105 and including a gate electrode 175, source/drain regions 150 in contact with the channel structure 140, and contact plugs 180 connected to the source/drain regions 150. The semiconductor device 100 may further include a device isolation layer 110, internal spacer layers 130, and an interlayer insulating layer 190. The gate structure GS may include dielectric layers 160 including at least one of a ferroelectric material and an antiferroelectric material, gate spacer layers 172, and a gate electrode 175.

In the semiconductor device 100, the active region 105 may have a fin shape, and the gate electrode 175 may be disposed between the active region 105 and the channel structure 140, between the first to third channel layers 141, 142, and 143 of the channel structure 140, and on the channel structure 140. Accordingly, the semiconductor device 100 may include a transistor having a multi-bridge channel FET (MBCFET™) structure, which is a gate-all-around field effect transistor.

The substrate 101 may have an upper surface extending in the X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium, but example embodiments are not limited thereto. The substrate 101 may be provided as a bulk wafer, an epitaxial layer, a silicon on insulator (SOI) layer, a semiconductor on insulator (SeOI) layer, or the like.

The substrate 101 may include the active region 105 disposed in an upper portion thereof. The active region 105 may be defined by the device isolation layer 110 in the substrate 101 and may be disposed to extend in the first direction, for example, the X-direction. However, according to the description method, it may be possible to describe the active region 105 as a structure separate from the substrate 101. The active region 105 may have a structure protruding upwardly. The active region 105 may be formed as a portion of the substrate 101, or may include an epitaxial layer grown from the substrate 101. However, on both sides of the gate structure GS, the active region 105 may be partially recessed to form recess regions, and source/drain regions 150 may be disposed in the recess regions. In some example embodiments, the active region 105 may or may not include a well region including impurities.

The device isolation layer 110 may define the active region 105 in the substrate 101. The device isolation layer 110 may be formed by, for example, a shallow trench isolation (STI) process. The device isolation layer 110 may expose an upper surface of the active region 105, or partially expose an upper portion of the active region 105. In some example embodiments, the device isolation layer 110 may have a curved upper surface to have a higher level as it approaches the active region 105. The device isolation layer 110 may be formed of an insulating material. The device isolation layer 110 may include, for example, oxide, nitride, or combinations thereof.

The channel structure 140 may be disposed on the active region 105 in regions in which the active region 105 intersects the gate structure GS. The channel structure 140 may include first to third channel layers 141, 142, and 143, which are two or more, a plurality of channel layers spaced apart from each other in the Z-direction. However, the number and shape of the channel layers constituting one channel structure 140 may be variously changed in the example embodiments. The channel structure 140 may be connected to the source/drain regions 150. The channel structure 140 may have a width equal to or less than a width of the active region 105 in the Y-direction, and may have a width equal to or similar to a width of the gate structure GS in the X-direction. In some example embodiments, the channel structure 140 may have a reduced width such that side surfaces are positioned below the gate structure GS in the X-direction.

The channel structure 140 may be formed of a semiconductor material, and may include, for example, at least one of a group IV semiconductor material, an oxide semiconductor material, and a two-dimensional transition metal chalcogenide compound semiconductor material, but example embodiments are not limited thereto. In some example embodiments, the channel structure 140 may include an impurity region positioned in a region adjacent to the source/drain regions 150.

The group IV semiconductor may be, for example, at least one of silicon (Si), silicon germanium (SiGe), and germanium (Ge), and may have a single crystal, polycrystalline, or amorphous structure, but example embodiments are not limited thereto. For example, in the semiconductor device 100, since the dielectric layers 160 include a ferromagnetic material or an antiferromagnetic material, leakage current characteristics are secured, and thus, the channel structure 140 may have a polycrystalline or amorphous structure instead of a single crystal.

The oxide semiconductor material may be an oxide including at least one of indium (In), zinc (Zn), and gallium (Ga). The oxide semiconductor material may include at least one of, for example, zinc tin oxide (ZTO), indium zinc oxide (IZO), ZnO, indium gallium zinc oxide (IGZO), indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc Oxide (HfInZnO), Tin Indium Zinc Oxide (SnInZnO), Aluminum Tin Indium Zinc Oxide (AlSnInZnO), Silicon Indium Zinc Oxide (SiInZnO), Zinc Tin Oxide (ZnSnO), Aluminum Zinc Tin Oxide (AlZnSnO), Gallium Zinc Tin Oxide (GaZnSnO), zirconium zinc tin oxide (ZrZnSnO), and indium gallium silicon oxide (InGaSiO), but example embodiments are not limited thereto.

The two-dimensional transition metal chalcogenide compound semiconductor material may have a two-dimensional layered structure, for example, and may include at least one of $MoS_2$, $MoSe_2$, $WS_2$, and $WSe_2$.

The gate structure GS may be disposed to intersect the active region 105 and the channel structure 140 to extend in the second direction, for example, the Y-direction. A channel region of the memory element may be formed in the channel structure 140 intersecting the gate electrode 175 of the gate structure GS. The gate structure GS includes a gate electrode 175, dielectric layers 160 between the gate electrode 175 and the channel structure 140, and gate spacer layers 172 on side surfaces of the gate electrode 175. In some example embodiments, the gate structure GS may further include a capping layer on an uppermost surface of the gate electrode 175. Alternatively, a portion of the interlayer insulating layer 190 on the gate structure GS may be referred to as a gate capping layer.

The dielectric layers 160 may be disposed between the active region 105 and the gate electrode 175 and between the channel structure 140 and the gate electrode 175, and may be disposed to cover at least a portion of the surfaces of the gate electrode 175. For example, the dielectric layers 160 may be disposed to surround all surfaces except for the uppermost surface of the gate electrode 175. The dielectric layers 160 may extend between the gate electrode 175 and the gate spacer layers 172, but example embodiments are not limited thereto. The dielectric layers 160 may include first to third dielectric layers 161, 162 and 163 surrounding the first to third channel layers 141, 142 and 143, respectively, and a lowermost fourth dielectric layer 167 spaced apart from the first to third channel layers 141, 142 and 143.

The dielectric layers 160 may include a ferroelectric material or an antiferroelectric material. The dielectric layers 160 may include at least one selected from the group consisting of, for example, hafnium (Hf), zirconium (Zr), silicon (Si), yttrium (Y), aluminum (Al), gadolinium (Gd), strontium (Sr), lanthanum (La), scandium (Sc), and oxides thereof. The dielectric layers 160 may include, as a base material, at least one selected from the group consisting of, for example, hafnium oxide ($HfO_2$), zirconium oxide ($ZrO_2$), hafnium-zirconium oxide ($Hf_xZr_{1-x}O_2$, 0<x<1), and combinations thereof, and may further include at least one dopant material selected from the group consisting of hafnium (Hf), zirconium (Zr), silicon (Si), yttrium (Y), aluminum (Al), gadolinium (Gd), strontium (Sr), lanthanum (La), scandium (Sc), carbon (C), germanium (Ge), tin (Sn), lead (Pb), magnesium (Mg), calcium (Ca), barium (Ba), titanium (Ti), and combinations thereof. For example, the dielectric layers 160 may include hafnium oxide doped with at least one of zirconium (Zr), silicon (Si), yttrium (Y), aluminum (Al), gadolinium (Gd), strontium (Sr), lanthanum (La), and scandium (Sc), but example embodiments are not limited thereto.

The first to third dielectric layers 161, 162, and 163 may have different coercive voltages. In some example embodiments, the first to third dielectric layers 161, 162, and 163 may include the same or different materials and may have different thicknesses. Even when the first to third dielectric layers 161, 162, and 163 include the same material, the first to third dielectric layers 161, 162, and 163 have different thicknesses and may thus have different coercive voltages. This will be described in more detail with reference to FIG. 4 below.

In some example embodiments, the first dielectric layer 161 surrounding the first channel layer 141 may have a first thickness T1, the second dielectric layer 162 surrounding the second channel layer 142 may have a second thickness T2 greater than the first thickness T1, and the third dielectric layer 163 surrounding the third channel layer 143 may have a third thickness T3 greater than the second thickness T2. Each of the first to third thicknesses T1, T2, and T3 may, for example, be in a range of about 1 nm to about 30 nm. For example, the first thickness T1 may be in a range of about 1 nm to about 5 nm, and the third thickness T3 may be in a range of about 20 nm to about 30 nm. In some example embodiments, the position of the dielectric layer 160 having the highest and lowest coercive voltages may be variously changed. For example, the first dielectric layer 161 may have a greatest thickness, or the second dielectric layer 162 may have a greatest thickness.

The lowermost fourth dielectric layer 164 may have the same first thickness T1 as the adjacent first dielectric layer 161, but the present inventive concepts are not limited thereto. In the dielectric layers 160, a region extending vertically from the third dielectric layer 163 and in contact with the gate spacer layers 172 may also have the same third thickness T3 as the third dielectric layer 163, but the present inventive concepts are not limited thereto. In a cross-section in the X-direction, a region in which the dielectric layers 160 contact the inner spacer layers 130 may have the same thickness as the upper or lower dielectric layers 160. For example, the region may have the same thickness as the dielectric layers 160 thereon. In some example embodiments, the region may include a region in which the upper and lower dielectric layers 160 contact each other, and may include a region in which the thickness is changed accordingly.

A first distance D1 between the fourth dielectric layer 167 and the first dielectric layer 161 may be greater than a second distance D2 between the first dielectric layer 161 and the second dielectric layer 162, and the second distance D2 may be greater than a third distance D3 between the second dielectric layer 162 and the third dielectric layer 163, but the present inventive concept is not limited thereto.

The gate spacer layers 172 may be disposed on both side surfaces of the gate electrode 175, on the channel structure 140. The gate spacer layers 172 may insulate the source/drain regions 150 from the gate electrode 175. In some example embodiments, the shape of the gate spacer layers 172 may be variously changed, and in some example embodiments, the gate spacer layers 172 may be formed to have a multilayer structure. The gate spacer layers 172 may be formed of at least one of oxide, nitride, and oxynitride, and in detail, may be formed of a low-k film.

The gate electrode 175 may be disposed on the active region 105 to fill a gap between the channel structures 140 and extend above the channel structures 140. The gate electrode 175 may be spaced apart from the channel structure 140 by the dielectric layers 160. The gate electrode 175 may include a conductive material, for example, a metal nitride such as titanium nitride (TiN), tantalum nitride (TaN), or tungsten nitride (WN), and/or a metal material such as aluminum (Al), tungsten (W) or molybdenum (Mo), or a semiconductor material such as doped polysilicon, but example embodiments are not limited thereto. In some example embodiments, the gate electrode 175 may be formed of two or more multilayers.

The source/drain regions 150 may be disposed on both sides of the gate structure GS, to be located in recess regions partially recessed from the upper portions of the active regions 105. The source/drain regions 150 may be disposed to contact side surfaces of each of the first to third channel layers 141, 142, and 143 of the channel structure 140. The upper surfaces of the source/drain regions 150 may be positioned at the same or similar height as the lower surface of the uppermost gate electrode 175, and the height may be variously changed in example embodiments. The source/drain regions 150 may include impurities.

The inner spacer layers 130 may be disposed between the channel structures 140 and in parallel with the gate structure GS. The gate electrode 175 may be stably spaced apart from the source/drain regions 150 by the inner spacer layers 130, to be electrically isolated from each other. The inner spacer layers 130 may have a shape in which a side surface facing the gate structure GS is rounded to be convex inwardly toward the gate structure GS, but the present inventive concepts are not limited thereto. The inner spacer layers 130 may be formed of oxide, nitride, or oxynitride, and in detail, may be formed of a low-k film. However, in some example embodiments, the inner spacer layers 130 may be omitted. In some example embodiments, the gate structure GS or the source/drain regions 150 may be expanded in the X-direction to fill the region in which the inner spacer layers 130 are disposed.

The interlayer insulating layer 190 may be disposed to cover the source/drain regions 150 and the gate structure GS, and to cover the device isolation layer 110. The interlayer insulating layer 190 may include at least one of an oxide, a nitride, and an oxynitride, and may include, for example, a low-k material. In some example embodiments, the interlayer insulating layer 190 may include a plurality of insulating layers.

The contact plugs 180 may pass through the interlayer insulating layer 190 to be connected to the source/drain regions 150, and may apply an electrical signal to the source/drain regions 150. The contact plugs 180 may have slanted side surfaces in which a lower width is narrower than an upper width according to an aspect ratio, but the present inventive concepts are not limited thereto. The contact plugs 180 may extend from an upper portion to, for example, be lower than a lower surface of the third channel layer 143, but the present inventive concepts are not limited thereto. In some example embodiments, the contact plugs 180 may be disposed to contact along upper surfaces of the source/drain regions 150 without recessing the source/drain regions 150. Although not illustrated, the contact plug may also be connected to the gate electrode 175.

The contact plugs 180 may include a metal silicide layer positioned in a region in contact with the source/drain regions 150, and may further include a barrier layer disposed on an upper surface of the metal silicide layer and sidewalls of the contact plugs 180. The barrier layer may include, for example, a metal nitride such as titanium nitride (TiN), tantalum nitride (TaN), or tungsten nitride (WN). The contact plugs 180 may include a metal material such as, for example, aluminum (Al), tungsten (W), or molybdenum (Mo), but example embodiments are not limited thereto. In example embodiments, the number and arrangement of conductive layers constituting the contact plugs 180 may be variously changed.

When the semiconductor device 100 functions as a memory element, since the coercive voltages of the dielectric layers 160 respectively surrounding the first to third channel layers 141, 142, and 143 of the channel structure 140 are different, the memory element may implement a multilevel cell (MLC) or a multi-bit cell. This will be described in more detail below with reference to FIGS. 5 to 8.

In the description of the example embodiments below, descriptions overlapping those described above with reference to FIGS. 1 and 2 will be omitted.

Figure 3A:
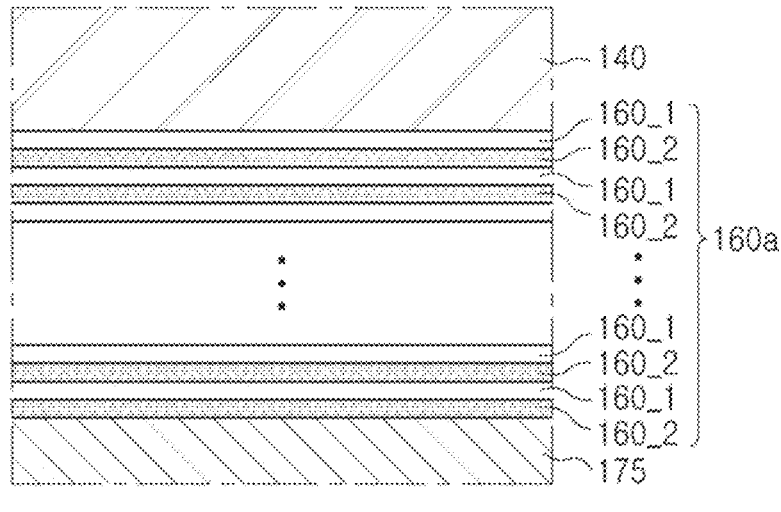
FIGS. 3A, 3B and 3C are partially enlarged views illustrating a semiconductor device according to some example embodiments.
Figure 3B:
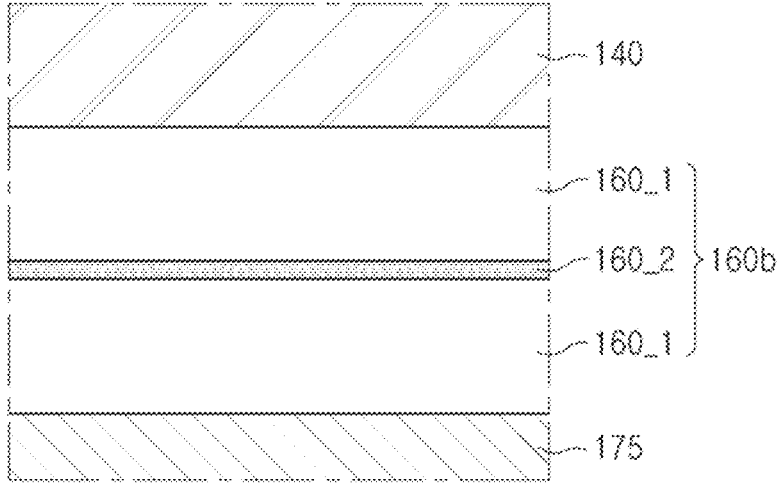
Figure 3C:
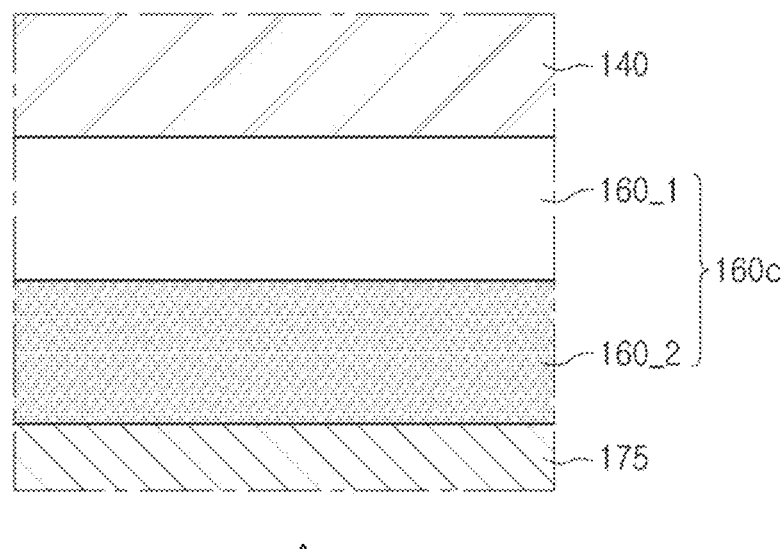

FIGS. 3A to 3C are partially enlarged views illustrating a semiconductor device according to some example embodiments. FIGS. 3A to 3C illustrate a partial region of the dielectric layer 160 corresponding to region 'A' in FIG. 2.

Referring to FIG. 3A, a dielectric layer 160a may include first and second dielectric layers 160_1 and 160_2 that are alternately stacked. The first and second dielectric layers 160_1 and 160_2 may include different ferroelectric materials or antiferroelectric materials. For example, the first dielectric layers 160_1 may include hafnium oxide (HfO$_2$), and the second dielectric layers 160_2 may include zirconium oxide (ZrO$_2$).

In FIGS. 3A to 3C, the first and second dielectric layers 160_1 and 160_2 may be independently described without being related to each other.

Referring to FIG. 3B, a dielectric layer 160b may include first dielectric layers 160_1 and a second dielectric layer 160_2 interposed between the first dielectric layers 160_1. The first dielectric layers 160_1 may include a ferroelectric material or an antiferroelectric material. The second dielectric layer 160_2 may include a ferroelectric material or an antiferroelectric material, or include a material that is not a ferroelectric or antiferroelectric material. For example, the first dielectric layers 160_1 may include hafnium zirconium oxide (HZO), and the second dielectric layer 160_2 may include aluminum oxide (Al$_2$O$_3$).

Referring to FIG. 3C, a dielectric layer 160c may include a first dielectric layer 160_1 and a second dielectric layer 160_2 sequentially disposed from the channel structure 140. The first dielectric layers 160_1 may include a material that is not a ferroelectric and may include a material that is not an antiferroelectric. The second dielectric layer 160_2 may include a ferroelectric material or an antiferroelectric material. For example, the first dielectric layers 160_1 may include silicon oxide (SiO$_2$), silicon nitride (Si$_3$N$_4$), silicon oxynitride (SiON), a high-k dielectric material, or combinations thereof. In this case, the high-k material refers to a dielectric material having a higher dielectric constant than that of silicon oxide (SiO$_2$). The high-k material may include, for example, aluminum oxide (Al$_2$O$_3$), tantalum oxide (Ta$_2$O$_3$), titanium oxide (TiO$_2$), yttrium oxide (Y$_2$O$_3$), zirconium oxide (ZrO$_2$), zirconium silicon oxide (ZrSi$_x$O$_y$), hafnium oxide (HfO$_2$), hafnium silicon oxide (HfSi$_x$O$_y$), lanthanum oxide (La$_2$O$_3$), lanthanum aluminum oxide (LaAl$_x$O$_y$), lanthanum hafnium oxide (LaHf$_x$O$_y$), hafnium aluminum oxide (HfAl$_x$O$_y$), praseodymium oxide (Pr$_2$O$_3$), or combinations thereof, but example embodiments are not limited thereto.

As described above with reference to FIGS. 3A to 3C, in some example embodiments, the respective dielectric layers 160a, 160b and 160c may have a single-layer structure as well as a multi-layer structure, and the detailed structure may be variously changed in the example embodiments.

Figure 4:
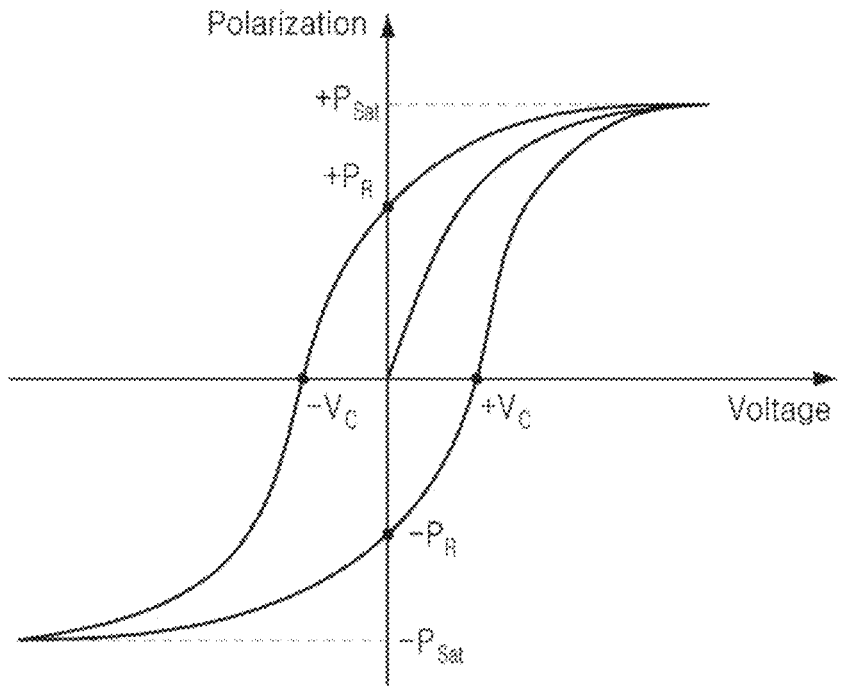
FIG. 4 illustrates a hysteresis curve of a ferroelectric material constituting a semiconductor device according to some example embodiments.

FIG. 4 illustrates a hysteresis curve of a ferroelectric material constituting a semiconductor device according to some example embodiments.

Referring to FIG. 4, if an electric field is not applied to the dielectric layer 160 (see FIG. 2) including a ferroelectric material, polarization does not occur. When the voltage across the dielectric layer 160 or the voltage applied to the gate electrode 175 is increased in the plus direction, the degree of polarization (or amount of charge) reaches a positive peak or maximum point ($+P_{sat}$), which is the saturation polarization point in the positive polarization region, from zero. Thereafter, even if the voltage across the dielectric layer 160 drops to 0 V again, the polarization degree does not drop to zero and remains at a positive residual point ($+P_R$), which is a remanent polarization point.

When the voltage across the dielectric layer 160 increases in the minus direction, the degree of polarization changes from the positive residual point ($+P_R$) to a negative peak or maximum point ($-P_{sat}$) in the negative polarization region. At this time, the ferroelectric material of the dielectric layer 160 is polarized in a direction opposite to the polarization direction at the positive maximum point ($+P_{sat}$). Thereafter, even when the voltage across the dielectric layer 160 drops to 0 V again, the polarization does not drop to zero and remains at the negative residual point ($-P_R$).

To change the polarization direction of the dielectric layer 160, a voltage should be applied in the opposite direction, and this voltage corresponds to the coercive voltage ($+V_C$, $-V_C$). The coercive voltage ($+V_C$, $-V_C$) is proportional to the thickness of the dielectric layer 160 and the coercive field ($E_C$) of the material of the dielectric layer 160. Accordingly, when the first to third dielectric layers 161, 162, and 163 constituting the dielectric layer 160 have the same material, the coercive voltage ($+V_C$, $-V_C$) may be increased in proportion to the thickness of the first to third dielectric layers 161, 162 and 163. When the first to third dielectric layers 161, 162 and 163 constituting the dielectric layer 160 have the same or substantially the same thickness and different materials, the coercive voltage ($+V_C$, $-V_C$) may increase in proportion to the coercive field of respective materials.

Figure 5:
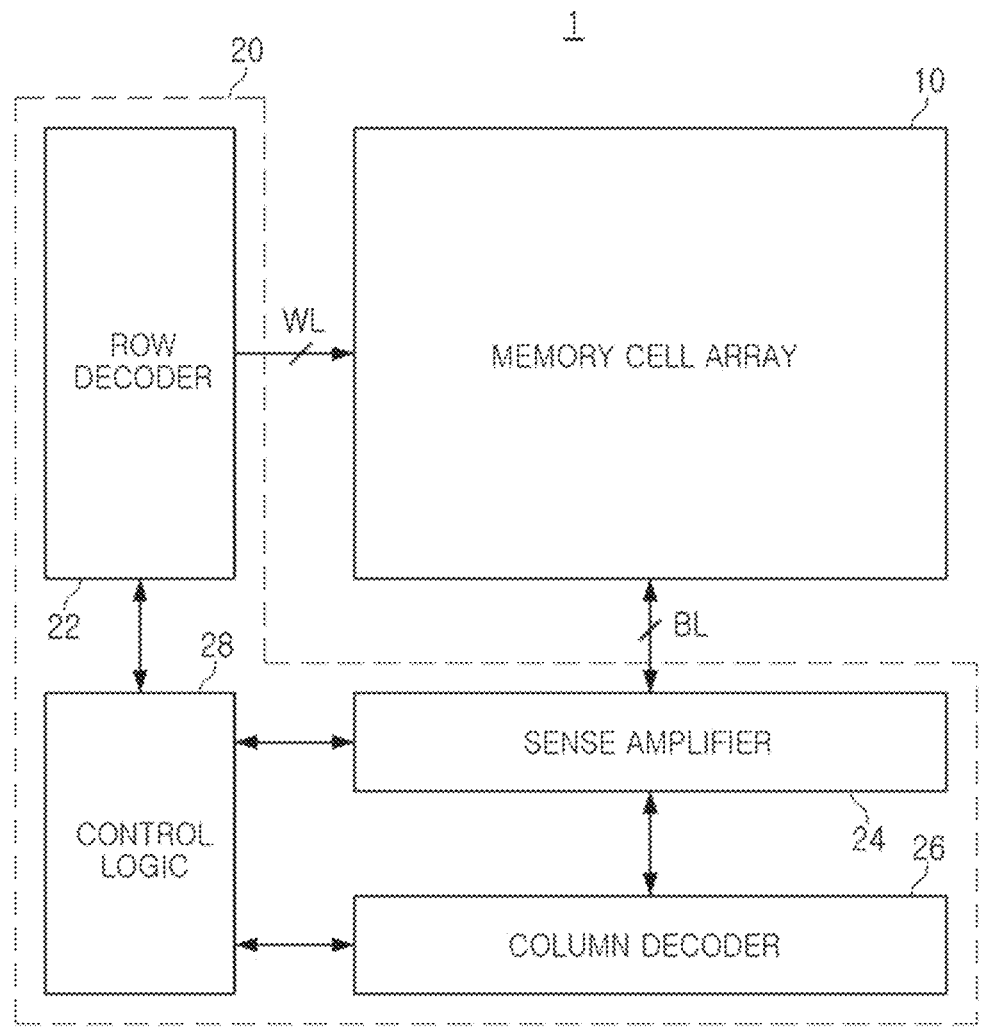
FIG. 5 is a block diagram illustrating a semiconductor device according to some example embodiments.

FIG. 5 is a block diagram illustrating a semiconductor device according to some example embodiments.

Referring to FIG. 5, a semiconductor device 1 may include a memory cell array 10 and a peripheral circuit region 20.

The memory cell array 10 may include memory cells or memory elements. In the memory cell array 10, the memory cells may be non-volatile memory cells. For example, the memory cells may have the structure described above with reference to FIGS. 1 to 3C or the structure described below with reference to FIGS. 9 to 12B.

The peripheral circuit region 20 may include peripheral circuits such as a row decoder 22, a sense amplifier 24, a column decoder 26, and a control logic 28. In the peripheral circuit region 20, the row decoder 22 may be connected to memory elements through a word line WL, and the sense amplifier 24 may be connected to memory elements through a bit line BL. The row decoder 22 may select a memory cell from which data is to be written or read, and the sense amplifier 24 may program data into or read data from the memory cell through a bit line. The column decoder 26 may transmit data to be recorded to the sense amplifier 24, or may transmit data read from the memory cell array 10 by the sense amplifier 24 to the control logic 28. The control logic 28 may control operations of the row decoder 22, the sense amplifier 24, and the column decoder 26.

Figure 6:
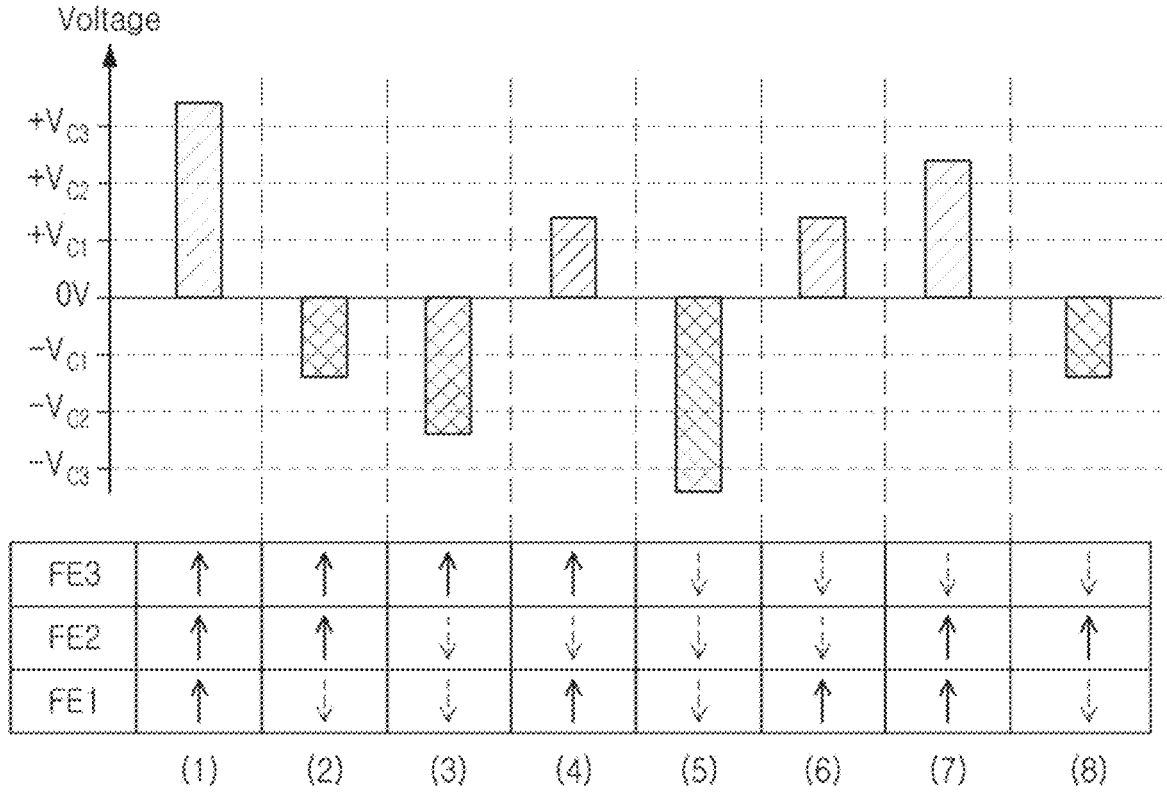
FIGS. 6, 7A and 7B are diagrams illustrating an operation of a semiconductor device according to some example embodiments.
Figure 7A:
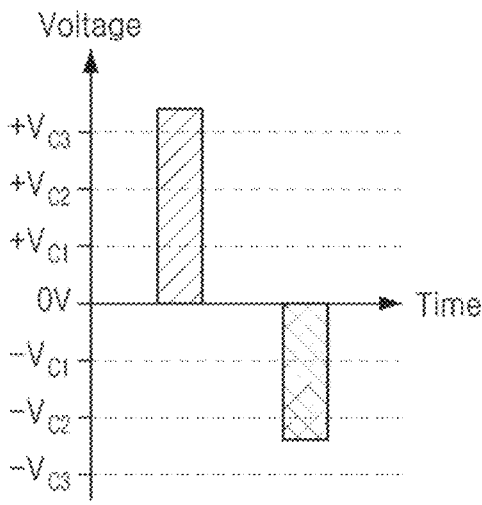
Figure 7B:
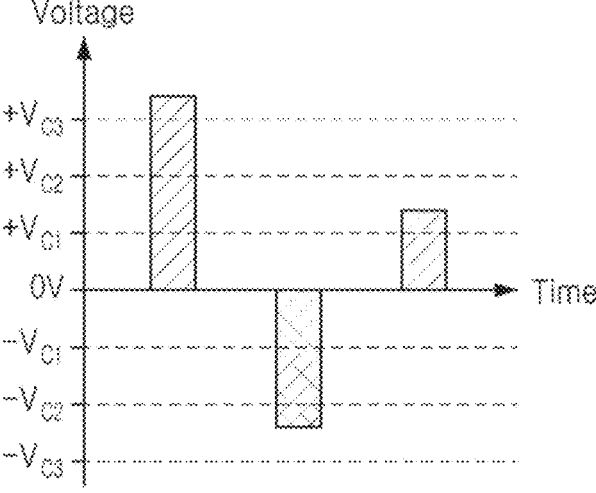

FIGS. 6 to 7B are diagrams illustrating an operation of a semiconductor device according to some example embodiments.

First, referring to FIG. 6, when the first to third dielectric layers 161, 162, and 163 of FIG. 2 are referred to as first to third ferroelectric layers FE1, FE2, and FE3, respectively, and respective coercive voltages are referred to as the first to third voltages ($+V_{C1}$, $+V_{C2}$, $+V_{C3}$, $V_{C1}$, $-V_{C2}$, $-V_{C3}$), a method of storing data in a single memory cell using as the first to third ferroelectric layers FE1, FE2, and FE3 is explained. For example, in the example embodiment illustrated in FIG. 6, one memory cell or memory element may store 3-bit data in a triple level cell (TLC) method. In FIG. 6, (1) to (8) refer to the polarization states of the first to third ferroelectric layers FE1, FE2, and FE3, and the voltages illustrated in respective upper portions indicate the program voltages finally input to implement the corresponding polarization states.

In detail, a voltage greater than or equal to the third positive voltage ($+V_{C3}$), for example, a first program voltage, is applied to the gate electrode 165 (refer to FIG. 3) to cause the polarization of the electric dipoles in all of the first to third ferroelectric layers FE1, FE2, and FE3 in the first direction, thereby setting the memory cell to the polarization state (1). In this specification, the magnitude of the voltage is described based on an absolute value.

In the case of the polarization state (2), in the gate electrode 165 of the memory cell set to the polarization state (1), by further applying a second program voltage equal to or greater than the first negative voltage ($-V_{C1}$) and lower than the second negative voltage ($-V_{C2}$), the polarization direction of the first ferroelectric layer FE1 may be implemented to be changed to a second direction opposite to the first direction.

When a second or third program voltage equal to or greater than the second negative voltage ($-V_{C2}$) and less than the third negative voltage ($-V_{C3}$) is applied to the polarization state (1) or (2), the polarization direction of the first and second ferroelectric layers FE1 and FE2 may be changed to a second direction opposite to the first direction. Accordingly, the first to third ferroelectric layers FE1, FE2, and FE3 may be in the polarization state (3). FIG. 7A illustrates a program method for implementing the polarization state (3) in this manner Referring to FIG. 7A, a program operation may be performed in the order of inputting a first program voltage equal to or greater than the third positive voltage ($+V_{C3}$) and then inputting a second program voltage equal to or greater than the second negative voltage ($-V_{C2}$) and less than the third negative voltage ($-V_{C3}$)

When a third program voltage equal to or greater than the first positive voltage ($+V_{C1}$) and less than the second positive voltage ($+V_{C2}$) is applied to the polarization state (3), the polarization direction of the first ferroelectric layer FE1 may be changed from the second direction back to the first direction, resulting in the polarization state (4). FIG. 7B illustrates a program method for implementing the polarization state (4) in this manner Referring to FIG. 7B, by sequentially inputting a first program voltage equal to or greater than the third positive voltage ($+V_{C3}$), a second program voltage equal to or greater than a second negative voltage ($-V_{C2}$) and less than a third negative voltage ($-V_{C3}$), and a third program voltage equal to or greater than a first positive voltage ($+V_{C1}$) and less than a second positive voltage ($+V_{C2}$), a program operation of setting the polarization states of the first to third ferroelectric layers FE1, FE2 and FE3 included in the memory cell to the polarization state (4) may be performed.

Similarly, when a first program voltage greater than or equal to the third negative voltage ($-V_{C3}$) is applied to the gate electrode 165, polarization may occur in all of the first to third ferroelectric layers FE1, FE2, and FE3 in the second direction, resulting in a polarized state (5). When a second program voltage equal to or greater than the first positive voltage ($+V_{C1}$) and less than the second positive voltage ($+V_{C2}$) is applied to the polarization state (5), the polarization direction of the first ferroelectric layer FE1 may be changed to the first direction, resulting in a polarization state (6). When a second or third program voltage equal to or greater than the second positive voltage (+$V_{C2}$) and less than the third positive voltage (+$V_{C3}$) is applied to the polarization state (5) or (6), the polarization direction of the first and second ferroelectric layers FE1 and FE2 may be changed to the first direction. Therefore, the polarization state (7) may be implemented. When a third program voltage equal to or greater than the first negative voltage (–$V_{C1}$) and less than the second negative voltage (–$V_{C2}$) is applied to the polarization state (7), the polarization direction of the first ferroelectric layer FE1 may be changed from the first direction back to the second direction, resulting in the polarization state (8).

The voltage applied to the gate electrode 165 may be performed and controlled by, for example, the peripheral circuit region 20 of FIG. 5. Data may be written by sequentially inputting program voltages having different signs to the memory cell implemented by the semiconductor device 100 of FIG. 2 as described above. The program voltages for writing one data may have different magnitudes as described above, and the first program voltage input initially may have the greatest magnitude. However, depending on the data to be written to the memory cell, the program operation may be completed only with a program voltage equal to or greater than the third positive voltage (+$V_{C3}$) or equal to or greater than the third negative voltage (–$V_{C3}$)

According to some example embodiments, when the number of channel layers is three in the memory cell and the number of dielectric layers is therefore three, eight different polarization states may be implemented as illustrated in FIG. 6, and therefore, one memory cell may store 3 bits. As such, in some example embodiments, when the number of channel layers of the memory cell is N (where N is a natural number equal to or greater than 2), data of up to N bits may be stored in the memory cell. For example, N bits of data or less may be stored in the memory cell. Also, as described above, 3-bit data may be written into one memory cell by inputting program voltages having different magnitudes a maximum of N times.

Figure 8:
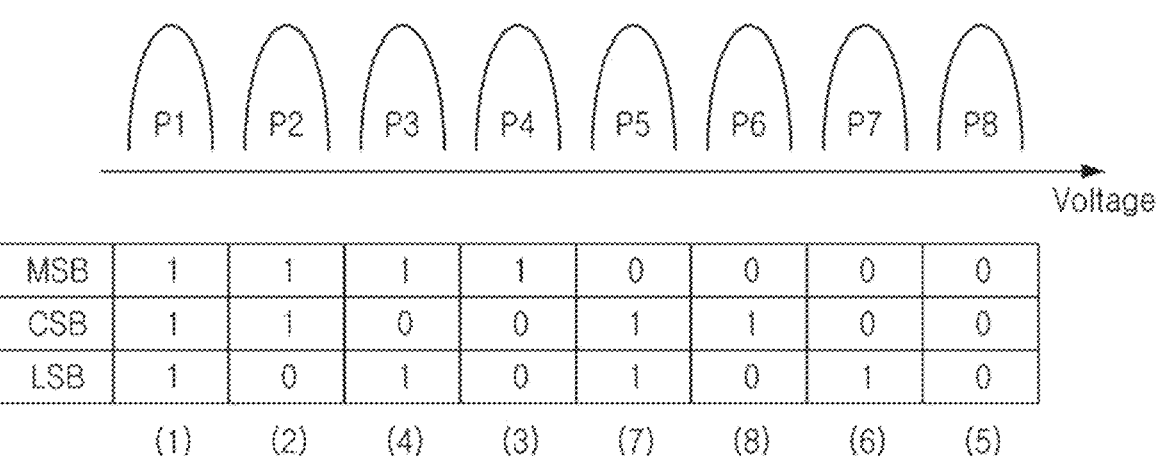
FIG. 8 is a diagram illustrating an operation of a semiconductor device according to some example embodiments.

FIG. 8 is a diagram illustrating an operation of a semiconductor device according to some example embodiments.

Referring to FIG. 8, the memory element of the semiconductor device 100 (see FIG. 2) may be programmed to have one of first to eighth states P1, P2, P3, P4, P5, P6, P7, and P8. In addition, the first to eighth states P1, P2, P3, P4, P5, P6, P7, and P8 may correspond to different threshold voltages. The threshold voltage of the memory element in the first program state P1 may be the lowest, and the threshold voltage of the memory element in the eighth program state P8 may be the highest. Also, the memory element may store 3-bit data including a least significant bit (LSB), a central significant bit (CSB), and a most significant bit (MSB). The first to eighth states P1, P2, P3, P4, P5, P6, P7, and P8 may be allocated to different 3-bit data.

In some example embodiments, the memory element may include the first to third ferroelectric layers FE1, FE2, and FE3, and may program the most significant bit MSB into the memory element by controlling the polarization state of the first ferroelectric layer FE1. Similarly, by controlling the polarization state of the second ferroelectric layer FE2, the central significant bit CSB may be programmed into the memory element, and the least significant bit LSB may be programmed into the memory element by controlling the polarization state of the third ferroelectric layer FE3.

Referring to FIGS. 6 and 8, the first program state P1, which is a polarization state (1), may be assigned as data '111', the second program state P2, which is a polarization state (2), may be assigned as data '110', the third program state P3, which is the polarization state (4), may be assigned as data '101', the fourth program state P4, which is the polarization state (3), may be assigned as data '100', the fifth program state P5, which is the polarization state (7), may be assigned as data '011', the sixth program state P6, which is the polarization state (8), may be assigned as data '010', the seventh program state P7, which is the polarization state (6), may be allocated as data '001', and the eighth program state P8, which is the polarization state 5, may be allocated as data '000'. As described above in FIG. 6, in the case of the polarization states (2) to (4) and the polarization states (6) to (8), to which the program voltage is input twice or more, at least portions of the first to third ferroelectric layers FE1, FE2 and FE3 may have different polarization states, and thus, at least portions of bits of data programmed in the memory element may have different values.

In some example embodiments, a read voltage between a peak or maximum value of the threshold voltage distribution corresponding to the fourth program state P4 and a reduced or minimum value of the threshold voltage distribution corresponding to the fifth program state P5 is applied to the gate electrode 165 of the memory element, and accordingly, a first read operation of determining the most significant bit (MSB) may be executed.

The read operation of the central significant bit CSB may include a second read operation using a read voltage between the peak maximum value of the threshold voltage distribution corresponding to the second program state P2 and the reduced or minimum value of the threshold voltage distribution corresponding to the third program state P3, or a second read operation using a read voltage between the peak or maximum value of the threshold voltage distribution corresponding to the sixth program state P6 and the reduced or minimum value of the threshold voltage distribution corresponding to the seventh program state P7.

The read operation of the least significant bit LSB may include one of a third read operation using a read voltage between the peak or maximum value of the threshold voltage distribution corresponding to the first program state P1 and the reduced or minimum value of the threshold voltage distribution corresponding to the second program state P2, a third read operation using a read voltage between the peak or maximum value of the threshold voltage distribution corresponding to the third program state P3 and the reduced or minimum value of the threshold voltage distribution corresponding to the fourth program state P4, a third read operation using a read voltage between the peak or maximum value of the threshold voltage distribution corresponding to the fifth program state P5 and the reduced or minimum value of the threshold voltage distribution corresponding to the sixth program state P6, and a third read operation using a read voltage between the peak or maximum value of the threshold voltage distribution corresponding to the seventh program state P7 and the reduced or minimum value of the threshold voltage distribution corresponding to the eighth program state P8. However, the detailed operation method of the read operation is not limited thereto.

Figure 9:
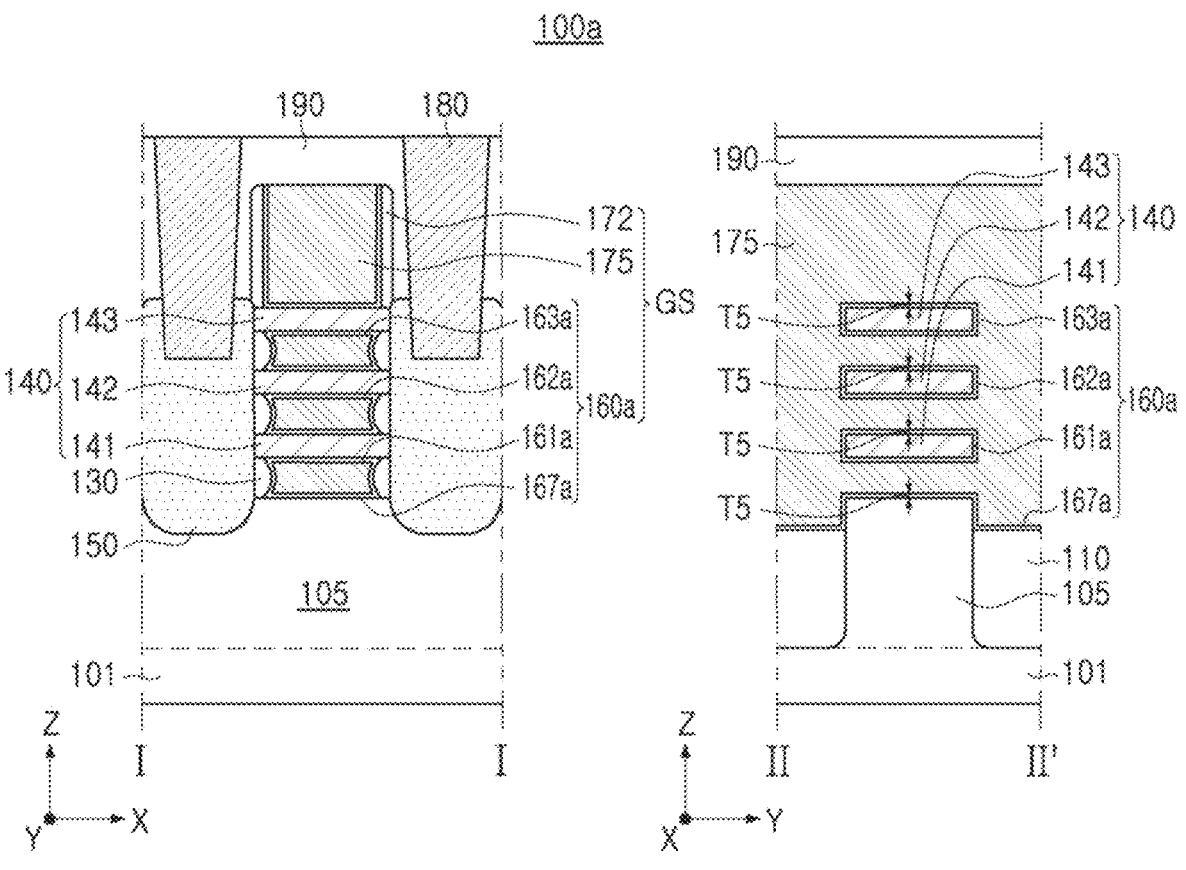
FIG. 9 is a cross-sectional view illustrating a semiconductor device according to some example embodiments, and illustrates a cross section corresponding to FIG. 2.

FIG. 9 is a cross-sectional view illustrating a semiconductor device according to some example embodiments. FIG. 9 illustrates a cross section corresponding to FIG. 2.

Referring to FIG. 9, in a semiconductor device 100a, first to fourth dielectric layers 161a, 162a, 163a, and 167a of dielectric layers 160*a* may all have the same or substantially the same thickness T5. However, some example embodiments, the coercive voltages of the first to third dielectric layers 161*a*, 162*a*, and 163*a* may be different from each other. To this end, the first to third dielectric layers 161*a*, 162*a*, and 163*a* may include ferroelectric or antiferroelectric materials having different coercive fields. Alternatively, in some example embodiments in which the first to third dielectric layers 161*a*, 162*a*, and 163*a* include the same or substantially the same ferroelectric or antiferroelectric material, as described above with reference to FIGS. 3A to 3C, the internal arrangement structure may be different.

Figure 10:
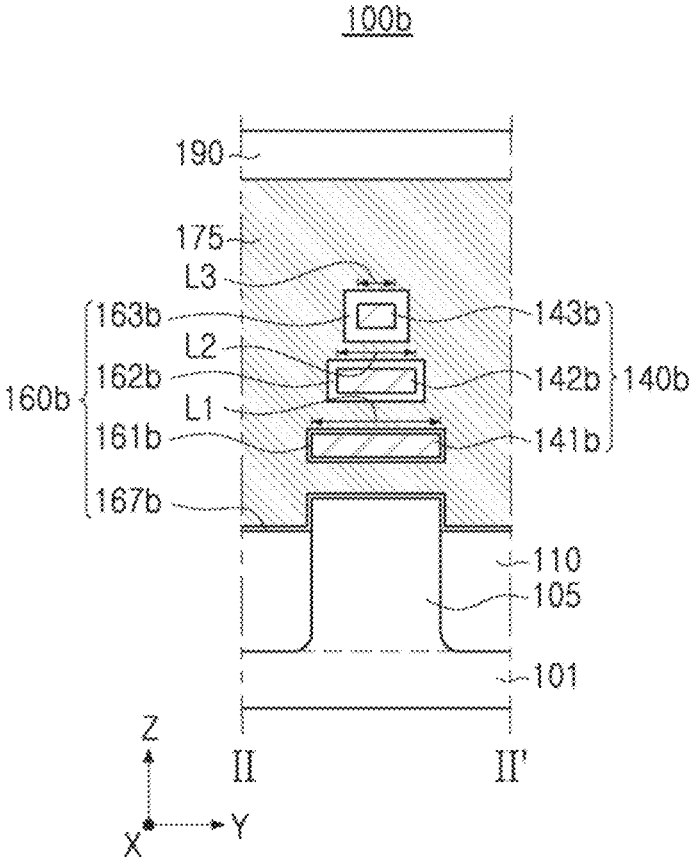
FIG. 10 is a cross-sectional view illustrating a semiconductor device according to some example embodiments.

FIG. 10 is a cross-sectional view illustrating a semiconductor device according to some example embodiments. FIG. 10 illustrates a cross section corresponding to the right side of FIG. 2.

Referring to FIG. 10, in a semiconductor device 100*b*, first to third channel layers 141*b*, 142*b*, and 143*b* constituting a channel structure 140*b* may have first to third widths L1, L2, and L3 different from each other in the Y-direction, which is the extension direction of the gate electrode 175. Accordingly, in the dielectric layers 160*b*, the first to third dielectric layers 161*b*, 162*b*, and 163*b* may also have different widths. In some example embodiments, the first to third dielectric layers 161*b*, 162*b*, and 163*b* may have different thicknesses and simultaneously have different widths.

The first channel layer 141*b* may have a first width L1, the second channel layer 142*b* may have a second width L2 less than the first width L1, and the third channel layer 143*b* may have a third width L3 less than the second width L2. The active region 105 is illustrated as having substantially the same width as the first width L1, but the present inventive concepts are not limited thereto. The first to third dielectric layers 161*b*, 162*b*, and 163*b* surrounding the first to third channel layers 141*b*, 142*b*, and 143*b*, respectively, may also have sequentially decreasing widths. The fourth dielectric layer 167*b* may have the same or substantially the same thickness as the first dielectric layer 161*b*, but the present inventive concepts are not limited thereto. However, in some example embodiments, the levels of the channel layer and the dielectric layer having a smallest width and a greatest width may be variously changed. For example, in some example embodiments, the third channel layer 143*b* may have a greatest width.

Since the first to third channel layers 141*b*, 142*b*, and 143*b* have different widths, when the devices including the respective first to third channel layers 141*b*, 142*b*, and 143*b* are in a turned-on state, the difference in the amount of current further increases according to the turned-on channel layer, and thus, the read operation described above with reference to FIG. 8 may be more easily performed.

Figure 11A:
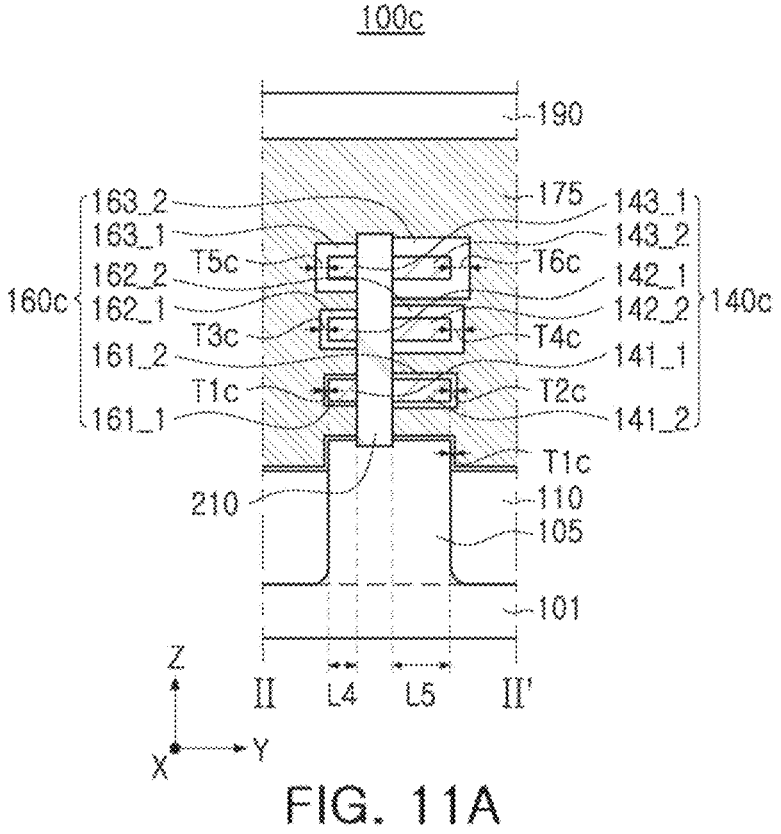
FIGS. 11A and 11B are cross-sectional views illustrating semiconductor devices according to some example embodiments.
Figure 11B:
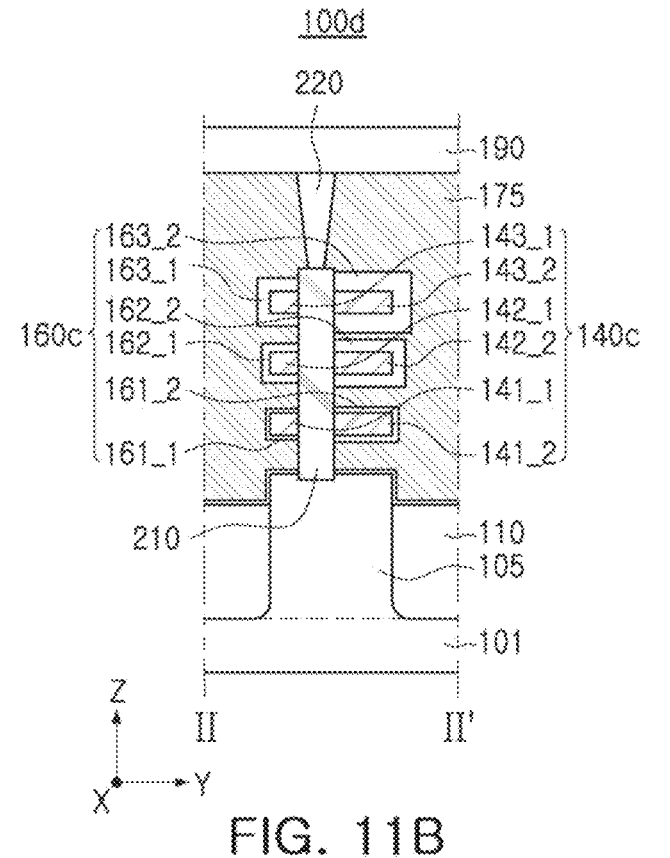

FIGS. 11A and 11B are cross-sectional views illustrating semiconductor devices according to some example embodiments. FIGS. 11A and 11B respectively illustrate cross-sections corresponding to the right side of FIG. 2.

Referring to FIG. 11A, a semiconductor device 100*c* may further include a channel separator 210, unlike the example embodiment of FIG. 2. The channel separator 210 may penetrate through a channel structure 140*c* in the Z-direction that is perpendicular or substantially perpendicular to the upper surface of the substrate 101, to divide the channel structure 140*c* and the dielectric layers 160*c* in the Y-direction. The channel separator 210 may include an insulating material.

The channel structure 140*c* may include a first layer 141_1 and a second layer 141_2 of the first channel layers

141_1 and 141_2 disposed on the same or substantially the same level, include a first layer 142_1 and a second layer 142_2 of the second channel layers 142_1 and 142_2 disposed on the same or substantially the same level, and include a first layer 143_1 and a second layer 143_2 of the third channel layers 143_1 and 143_2 disposed on the same or substantially the same level. The first layers 141_1, 142_1, and 143_1 and the second layers 141_2, 142_2, and 143_2 may have different widths in the Y-direction. The first layers 141_1, 142_1, and 143_1 may have a fourth width L4, and the second layers 141_2, 142_2, and 143_2 may have a fifth width L5 greater than the fourth width L4. The relative sizes of the fourth width L4 and the fifth width L5 may be variously changed in example embodiments. In some example embodiments, the fourth width L4 and the fifth width L5 may be equal or substantially equal to each other.

One side surfaces of the dielectric layers 160*c* in the Y-direction may contact the channel separator 210. In the dielectric layers 160*c*, first to sixth dielectric layers 161_1, 161_2, 162_1, 162_2, 163_1, and 163_2 surrounding the six channel layers 141_1, 141_2, 142_1, 142_2, 143_1, and 143_2, respectively, may have different first to sixth thicknesses T1*c*, T2*c*, T3*c*, T4*c*, T5*c*, and T6*c*. Accordingly, the first to sixth dielectric layers 161_1, 161_2, 162_1, 162_2, 163_1, and 163_2 may have different coercive voltages. In the first to sixth thicknesses T1*c*, T2*c*, T3*c*, T4*c*, T5*c*, and T6*c*, sizes from the first thickness T1*c* to the sixth thickness T6*c* may sequentially increase. However, in some example embodiments, the increase/decrease order and relative thicknesses of the first to sixth thicknesses T1*c*, T2*c*, T3*c*, T4*c*, T5*c*, and T6*c* may be variously changed.

Referring to FIG. 11B, a semiconductor device 100*d* may further include a gate separator 220 that is connected to the channel separator 210 and divides the gate electrode 175 in the Y-direction, unlike in the example embodiment of FIG. 11A. Accordingly, different electrical signals may be applied to the gate electrodes 175 divided in the Y-direction.

For the channel structure 140*c* and the dielectric layers 160*c*, the description described above with reference to FIG. 11A may be equally applied. However, in some embodiments, in the dielectric layers 160*c*, the dielectric layers surrounding the channel layers 141_1, 141_2, 142_1, 142_2, 143_1, and 143_2 disposed on the same or substantially the same level may have the same or substantially the same thickness, unlike in the example embodiment of FIG. 11A. For example, the first dielectric layer 161_1 and the second dielectric layer 161_2 may have the same or substantially the same thickness, the third dielectric layer 162_1 and the fourth dielectric layer 162_2 may have the same or substantially the same thickness, and the fifth dielectric layer 163_1 and the sixth dielectric layer 163_2 may have the same or substantially the same thickness. In some example embodiments, in a range in which the first dielectric layer 161_1, the third dielectric layer 162_1, and the fifth dielectric layer 163_1 disposed to overlap in the Z-direction have different thicknesses, and in a range in which the second dielectric layer 161_2, the fourth dielectric layer 162_2 and the sixth dielectric layer 163_2 disposed to overlap in the Z-direction have different thicknesses, the thicknesses of the dielectric layers 160*c* may be variously changed.

Figure 12A:
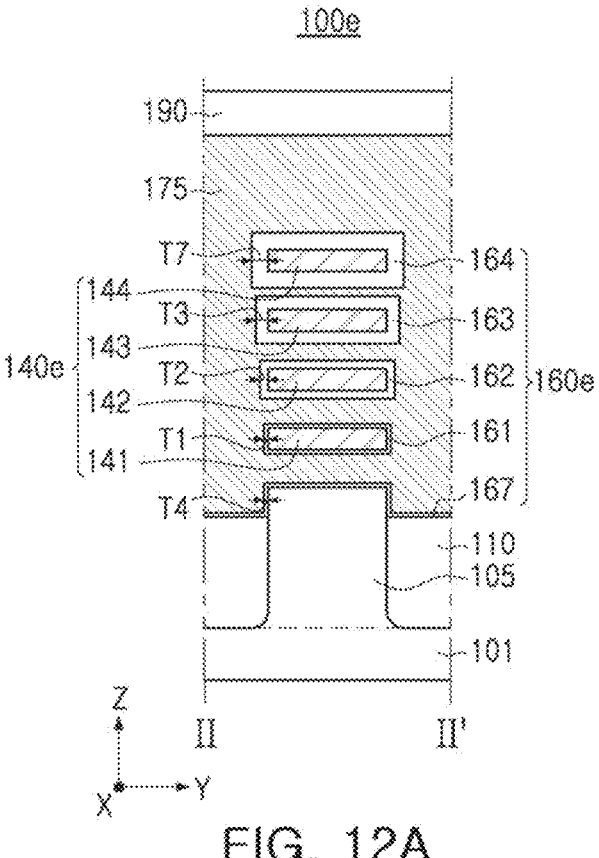
FIGS. 12A and 12B are cross-sectional views illustrating semiconductor devices according to some example embodiments.
Figure 12B:
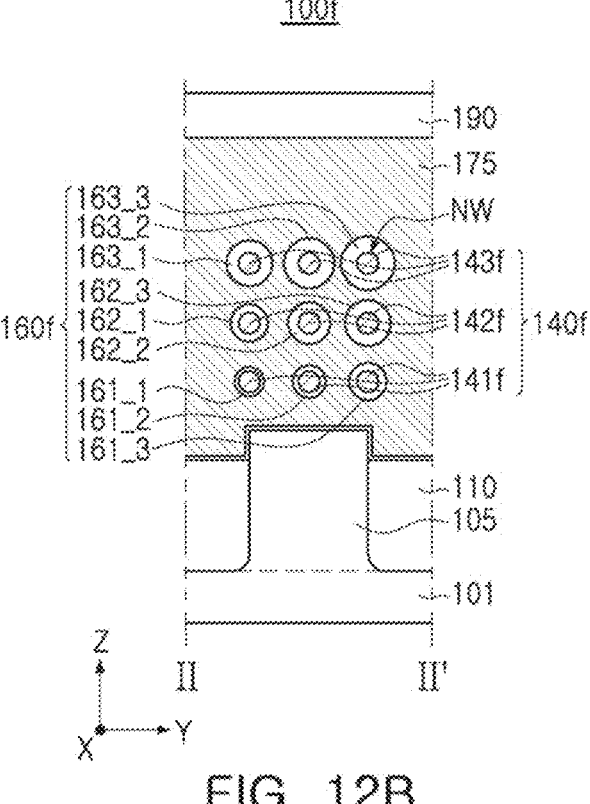

FIGS. 12A and 12B are cross-sectional views illustrating semiconductor devices according to some example embodiments. FIGS. 12A and 12B respectively illustrate cross-sections corresponding to the right side of FIG. 2.

Referring to FIG. 12A, in a semiconductor device 100*e*, a channel structure 140*e* may include first to fourth channel layers 141, 142, 143 and 144, and dielectric layers 160*e* may include first to fifth dielectric layers 161, 162, 163, 167, and 164. A fifth dielectric layer 164 may be disposed to surround the fourth channel layer 144, and may have a thickness T7 different from first to third thicknesses T1, T2, and T3 of the third dielectric layer 163. For example, the thickness T7 of the third dielectric layer 163 may be greater than the third thickness T3, but is not limited thereto. The first to third dielectric layers 161, 162 and 163 and the fifth dielectric layer 164 may have different coercive voltages.

As such, in some example embodiments, the number of channel layers constituting the channel structure 140e may be variously changed, and accordingly, the number of dielectric layers surrounding the channel layers may also be variously changed. For example, according to the semiconductor device 100e of the present example embodiment, similar to that described above with reference to FIGS. 6 to 8, a quad level cell (QLC) may be implemented, and a maximum of 4 bits may be stored.

Referring to FIG. 12B, in a semiconductor device 100f, first to third channel layers 141f, 142f, and 143f constituting a channel structure 140f may include nanowires NW having a relatively small length in the Y-direction, respectively. Accordingly, the first to third channel layers 141f, 142f, and 143f may respectively include a plurality, for example, three nanowires NW. However, the number of nanowires NW disposed on the same or substantially the same level and the number of nanowires NW disposed in the Z-direction may be variously changed in some example embodiments.

Dielectric layers 160f may include first to ninth dielectric layers 161_1, 161_2, 161_3, 162_1, 162_2, 162_3, 163_1, 163_2, and 163_3 surrounding the nanowires NW, respectively. The first to ninth dielectric layers 161_1, 161_2, 161_3, 162_1, 162_2, 162_3, 163_1, 163_2, and 163_3 may have different coercive voltages. For example, as in the present embodiment, the first to ninth dielectric layers 161_1, 161_2, 161_3, 162_1, 162_2, 162_3, 163_1, 163_2, and 163_3 may have different thicknesses.

FIGS. 13A to 13E are diagrams illustrating a process sequence to illustrate a method of manufacturing a semiconductor device according to some example embodiments. FIGS. 13A to 13E illustrate an example embodiment of a method of manufacturing the semiconductor device of FIGS. 1 and 2, and respectively illustrate cross sections corresponding to FIG. 2.

Figure 13A:
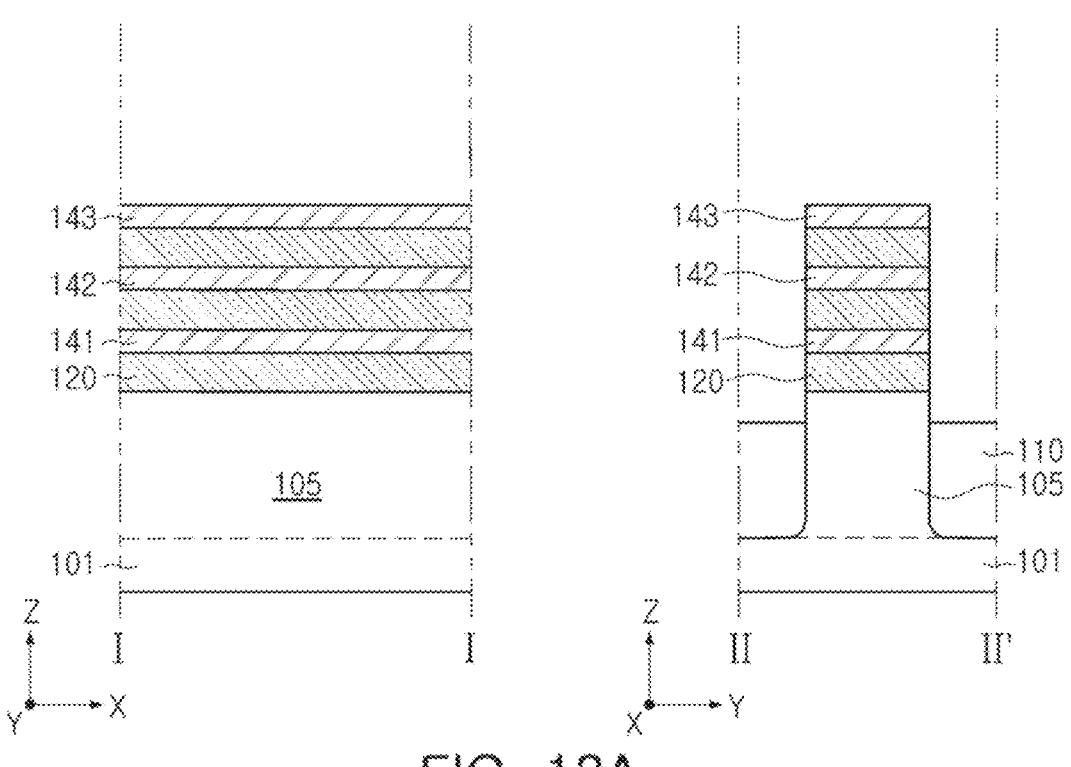
FIGS. 13A, 13B, 13C, 13D, and 13E are diagrams illustrating a process sequence in order to illustrate a method of manufacturing a semiconductor device according to some example embodiments.

Referring to FIG. 13A, sacrificial layers 120 and first to third channel layers 141, 142, and 143 are alternately stacked on a substrate 101, and an active structure including an active region 105 may be formed.

The sacrificial layers 120 may be replaced with the dielectric layers 160 and the gate electrode 175 through a subsequent process, as illustrated in FIG. 2. The sacrificial layers 120 may be formed of a material having etch selectivity with respect to the first to third channel layers 141, 142, and 143. The first to third channel layers 141, 142, and 143 may include a material different from a material of the sacrificial layers 120. The sacrificial layers 120 and the first to third channel layers 141, 142, and 143 may include a semiconductor material which contains at least one of silicon (Si), silicon germanium (SiGe) and germanium (Ge) and which includes different materials, and may or may not include impurities. For example, the sacrificial layers 120 may include silicon germanium (SiGe), and the first to third channel layers 141, 142, and 143 may include silicon (Si).

The sacrificial layers 120 and the first to third channel layers 141, 142, and 143 may be formed by performing an epitaxial growth process from the substrate 101. The number of layers of the channel layers 141, 142, and 143 alternately stacked with the sacrificial layers 120 may be variously changed in some example embodiments.

Next, the active structure may be formed by patterning the sacrificial layers 120, the first to third channel layers 141, 142, and 143, and an upper region of the substrate 101. The active structure may include the sacrificial layers 120 and the first to third channel layers 141, 142, and 143 that are alternately stacked on each other, and may further include the active regions 105 formed to protrude upwardly by removing a portion of the substrate 101. The active structure may be formed in the form of a line extending in one direction, for example, the X-direction. Depending on the aspect ratio, the side surfaces of the active structure may be inclined to increase in width downwardly.

The device isolation layer 110 may be formed in the region from which the substrate 101 has been partially removed by filling the region with the insulating material and then partially removing the insulating material such that the active region 105 protrudes. The upper surface of the device isolation layer 110 may be formed to be lower than the upper surface of the active region 105.

Figure 13B:
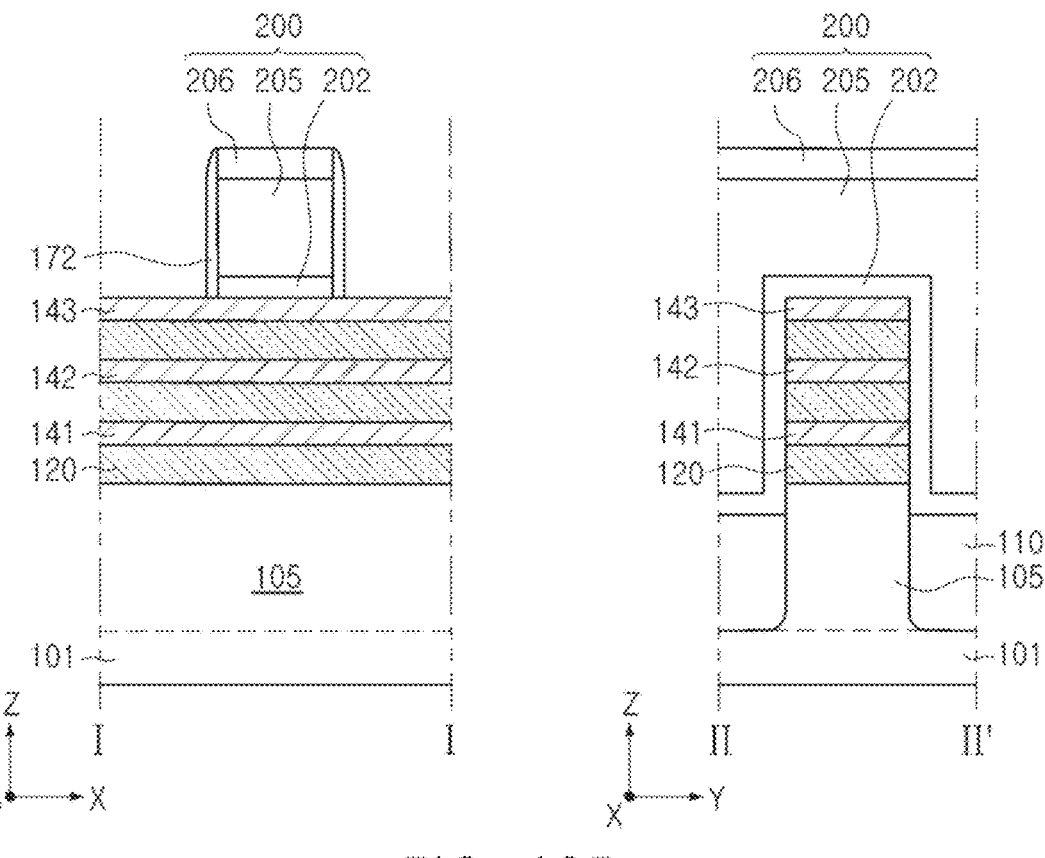

Referring to FIG. 13B, a sacrificial gate structure 200 and gate spacer layers 172 may be formed on the active structure.

The sacrificial gate structure 200 may be a sacrificial structure formed in a region in which the gate electrode 175 and the dielectric layer 160 on the channel structure 140 are disposed through a subsequent process, as illustrated in FIG. 2. The sacrificial gate structure 200 may have a line shape that intersects the active structure and extends in one direction. The sacrificial gate structure 200 may extend, for example, in a Y-direction.

The sacrificial gate structure 200 may include first and second sacrificial gate layers 202 and 205 and a mask pattern layer 206 that are sequentially stacked. The first and second sacrificial gate layers 202 and 205 may be patterned using a mask pattern layer 206. The first and second sacrificial gate layers 202 and 205 may be an insulating layer and a conductive layer, respectively, but are not limited thereto. In some example embodiments, the first and second sacrificial gate layers 202 and 205 may be formed of one layer. For example, the first sacrificial gate layer 202 may include silicon oxide, and the second sacrificial gate layer 205 may include polysilicon. The mask pattern layer 206 may include silicon oxide and/or silicon nitride.

The gate spacer layers 172 may be formed on both sidewalls of the sacrificial gate structure 200. The gate spacer layers 172 may be formed of a low-k material, and may include, for example, at least one of SiO, SiN, SiCN, SiOC, SiON, and SiOCN, but example embodiments are not limited thereto.

Figure 13C:
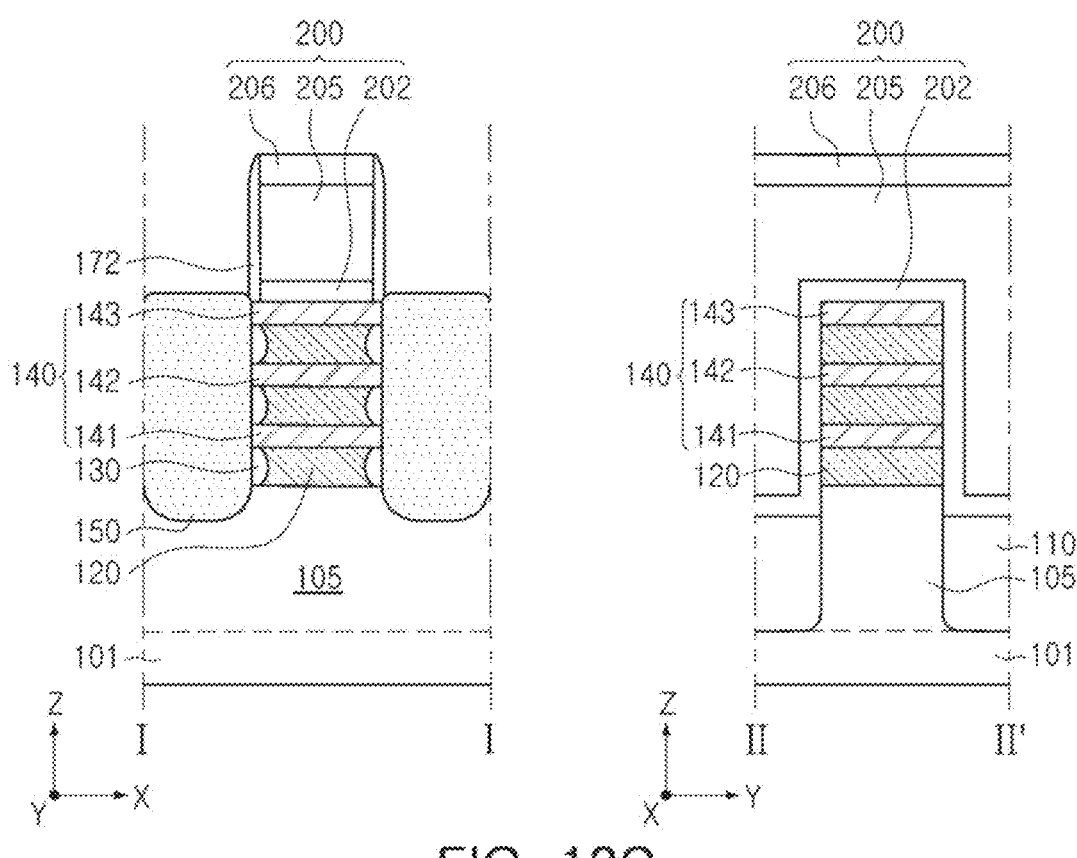

Referring to FIG. 13C, recess regions may be formed by partially removing the sacrificial layers 120 and the first to third channel layers 141, 142, and 143 exposed by the sacrificial gate structure 200, and source/drain regions 150 may be formed in the recess regions.

First, portions of the exposed sacrificial layers 120 and first to third channel layers 141, 142, and 143 are removed using the sacrificial gate structure 200 and the gate spacer layers 172 as masks, thereby forming the recess regions. Accordingly, the first to third channel layers 141, 142, and 143 may form the channel structure 140 having a limited length in the X-direction.

Next, the sacrificial layers 120 may be partially removed from the side surface, and inner spacer layers 130 may be formed. The sacrificial layers 120 may be selectively etched with respect to the channel structure 140 by, for example, a wet etching process, and removed to a desired (or, alternatively predetermined) depth from the side surface in the X-direction. The sacrificial layers 120 may have inwardly concave side surfaces by side etching as described above. However, the detailed shape of the side surfaces of the sacrificial layers 120 is not limited to that illustrated in FIG. 13C. The inner spacer layers 130 may be formed by filling the region from which the sacrificial layers 120 have been removed with an insulating material and then removing the insulating material deposited on the outside of the channel structure 140. The inner spacer layers 130 may be formed of the same material as a material of the gate spacer layers 172, but the present inventive concepts are not limited thereto. For example, the inner spacer layers 130 may include at least one of SiN, SiCN, SiOCN, SiBCN, and SiBN.

Next, the source/drain regions 150 may be formed by growing from side surfaces of the active regions 105 and the channel structure 140 by, for example, a selective epitaxial process. The source/drain regions 150 may include impurities by in-situ doping, and may include a plurality of layers having different doping elements and/or doping concentrations.

Figure 13D:
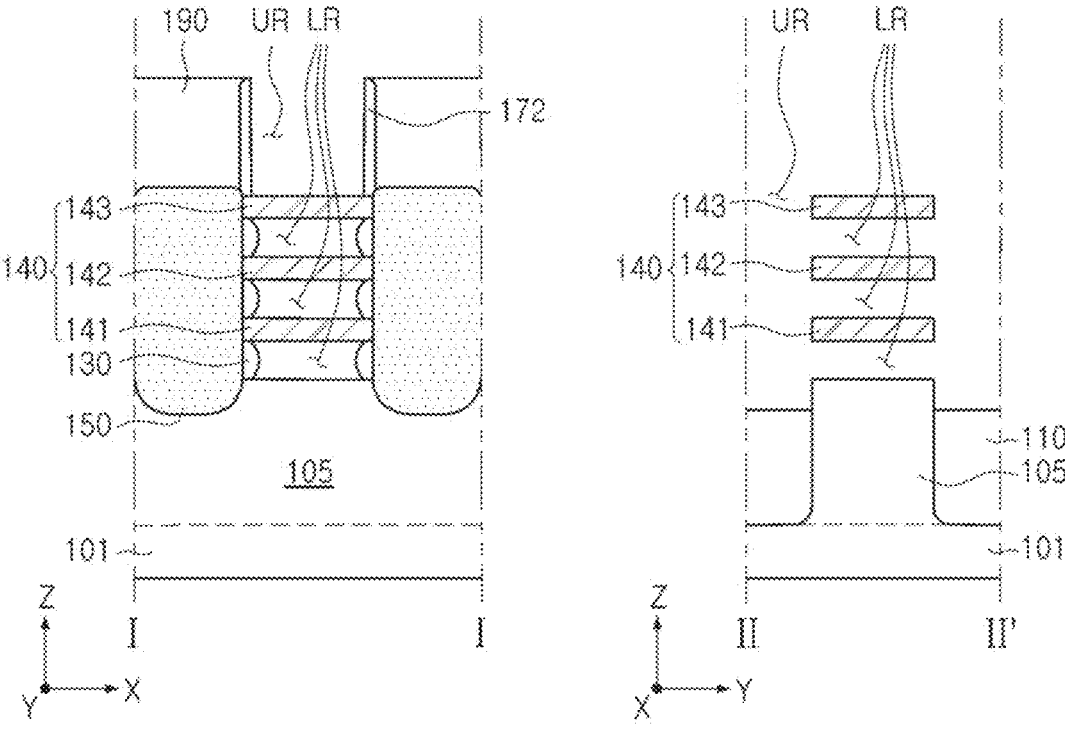

Referring to FIG. 13D, an upper gap region UR and a lower gap regions LR may be formed by forming an interlayer insulating layer 190 and removing the sacrificial gate structure 200 and the sacrificial layers 120.

The interlayer insulating layer 190 may be formed by forming an insulating layer covering the sacrificial gate structure 200 and the source/drain regions 150 and performing a planarization process to expose the mask pattern layer 206.

The sacrificial gate structure 200 may be selectively removed with respect to the gate spacer layers 172, the interlayer insulating layer 190, the channel structure 140, and the inner spacer layers 130. Next, the sacrificial layers 120 may be selectively removed from side surfaces of the sacrificial layers 120 in the Y-direction, exposed through the upper gap region UR. In this operation, the sacrificial layers 120 include a material different from a material of the channel structure 140 and may thus be selectively removed with respect to the channel structure 140 by a wet etching process.

Figure 13E:
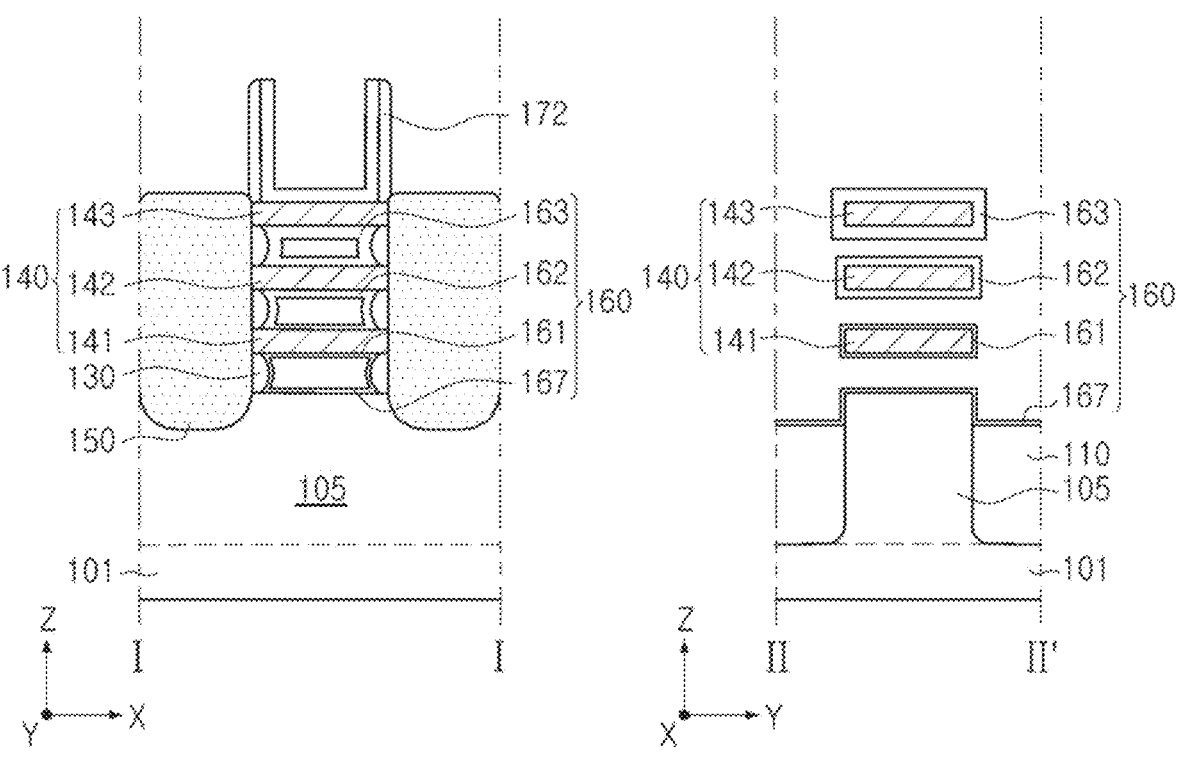

Referring to FIG. 13E, the dielectric layers 160 may be formed in the upper gap region UR and the lower gap region LR.

The dielectric layers 160 may be formed to surround the first to third channel layers 141, 142, and 143 with different thicknesses. For example, after forming a dielectric layer having a thickness of the first and fourth dielectric layers 161 and 167 to surround the first to third channel layers 141, 142, and 143, a mask layer or a sacrificial layer may be formed to cover the first and fourth dielectric layers 161 and 167. Next, after further forming a dielectric material to the thickness of the second dielectric layer 162 in the exposed region, a mask layer or a sacrificial layer may be formed to cover the second dielectric layer 162. Next, a dielectric material may be further formed in the exposed region to have a thickness of the third dielectric layer 163 to form the first to fourth dielectric layers 161, 162, 163, and 167. However, the method of forming the dielectric layers 160 to have different thicknesses is not limited thereto.

Next, referring to FIG. 2 together, the gate electrode 175 may be formed to form the gate structure GS, and contact plugs 180 may be formed.

The gate electrode 175 may be formed to completely fill the upper gap region UR and the lower gap regions LR.

Accordingly, the gate structure GS including the gate spacer layers 172, the dielectric layers 160, and the gate electrode 175 may be formed.

Next, contact holes exposing the source/drain regions 150 may be formed in the interlayer insulating layer 190, and the contact plugs 180 may be formed by filling the contact holes with a conductive material. Although not illustrated, a wiring structure connected to the contact plugs 180 may be further formed on the contact plugs 180. Accordingly, the semiconductor device 100 of FIG. 2 may be manufactured.

As set forth above, in the MBCFET structure, as the dielectric layers have different coercive voltages, a semiconductor device having improved integration and electrical characteristics may be provided.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments have been illustrated and described above, it will be apparent to those skilled in the art that modifications and variations could be made without departing from the scope of the present inventive concepts.

What is claimed is:

1. A semiconductor device comprising:
   a substrate including an active region extending in a first direction;
   a gate electrode on the substrate, the gate electrode extending in a second direction and intersecting the active region;
   a plurality of channel layers on the active region, the plurality of channel layers spaced apart from each other in a third direction, the third direction perpendicular to an upper surface of the substrate, and the plurality of channel layers surrounded by the gate electrode;
   a plurality of dielectric layers between the plurality of channel layers and the gate electrode, the plurality of dielectric layers including at least one of a ferroelectric material or an anti-ferroelectric material, and each of the plurality of dielectric layers has a different coercive voltage; and source/drain regions in recess regions in which the active region is recessed, the source/drain regions on both sides of the gate electrode, and the source/drain regions in contact with the plurality of channel layers.

2. The semiconductor device of claim 1, wherein each of the plurality of dielectric layers has a different thickness.

3. The semiconductor device of claim 1, wherein each of the plurality of dielectric layers includes a ferroelectric material having a different coercive field.

4. The semiconductor device of claim 1, wherein at least one of the plurality of dielectric layers defines a structure including alternately stacked first and second ferroelectric layers, each of the first and second ferroelectric layers including a different material.

5. The semiconductor device of claim 1, wherein the plurality of dielectric layers include at least one of hafnium (Hf), zirconium (Zr), silicon (Si), yttrium (Y), aluminum (Al), gadolinium (Gd), strontium (Sr), lanthanum (La), scandium (Sc), or oxides thereof.

6. The semiconductor device of claim 5, wherein the plurality of dielectric layers include hafnium oxide doped with at least one of zirconium (Zr), silicon (Si), yttrium (Y), aluminum (Al), gadolinium (Gd), strontium (Sr), lanthanum (La), or scandium (Sc).

7. The semiconductor device of claim 1, wherein
each of the plurality of dielectric layers includes a first layer sequentially stacked with a second layer, and
the first layer does not include a ferroelectric material and the second layer includes a ferroelectric material.

8. The semiconductor device of claim 1, wherein each of the plurality of channel layers has a different width in the second direction.

9. The semiconductor device of claim 1, further comprising:
a channel separator penetrating through the plurality of channel layers in the third direction, the channel separator dividing the plurality of channel layers into first and second layers in the second direction.

10. The semiconductor device of claim 9, wherein
the plurality of dielectric layers includes a first dielectric layer surrounding the first layer, and a second dielectric layer surrounding the second layer, and
first and second dielectric layers at a same height level each have a different coercive voltage.

11. The semiconductor device of claim 1, wherein the plurality of channel layers include at least one of polycrystalline silicon (Si), silicon germanium (SiGe), an oxide semiconductor material, or a semiconductor material including a two-dimensional transition metal chalcogenide compound.

12. A semiconductor device comprising:
a substrate including an active region extending in a first direction;
a gate electrode on the substrate, the gate electrode extending in a second direction and intersecting the active region;
a first channel layer, a second channel layer, and a third channel layer spaced apart from each other in a third direction, the third direction perpendicular to an upper surface of the substrate, wherein the first channel layer, the second channel layer and the third channel layer are sequentially stacked on the active region, and wherein the first channel layer, the second channel layer and the third channel layer are surrounded by the gate electrode;
a first dielectric layer surrounding the first channel layer, a second dielectric layer surrounding the second channel layer, and a third dielectric layer surrounding the third channel layer, wherein the first dielectric layer, the second dielectric layer and the third dielectric layer are sequentially stacked in the third direction on the active region, wherein the first dielectric layer, the second dielectric layer and the third dielectric layer include at least one of a ferroelectric material or an anti-ferroelectric material, and wherein each of the first dielectric layer, the second dielectric layer and the third dielectric layer has a different thickness; and
source/drain regions in recess regions in which the active region is recessed, the source/drain regions on both sides of the gate electrode, and the source/drain regions in contact with the first channel layer, the second channel layer and the third channel layer.

13. The semiconductor device of claim 12, wherein the first dielectric layer has a first thickness, the second dielectric layer has a second thickness greater than the first thickness, and the third dielectric layer has a third thickness greater than the second thickness.

14. The semiconductor device of claim 12, wherein each of the first dielectric layer, the second dielectric layer and the third dielectric layer has a thickness in a range of 1 nm to 30 nm.

15. The semiconductor device of claim 12, wherein each of the first dielectric layer, the second dielectric layer and the third dielectric layer has a different coercive voltage.

16. A semiconductor device comprising:
a memory cell array including a plurality of memory elements; and
a peripheral circuit region including peripheral circuits configured to control the memory cell array,
wherein each of the plurality of memory elements includes
an active region extending in a first direction,
a gate electrode intersecting the active region, the gate electrode extending in a second direction,
a plurality of channel layers on the active region, the plurality of channel layers spaced apart from each other in a third direction, the third direction perpendicular to an upper surface of the active region, and the plurality of channel layers surrounded by the gate electrode, and
a plurality of dielectric layers between the plurality of channel layers and the gate electrode, the plurality of dielectric layers including at least one of a ferroelectric material or an anti-ferroelectric material, and
wherein in each of the plurality of memory elements, a number of the plurality of channel layers is N, where N is a natural number equal to or greater than 2, and each of the plurality of memory elements is configured to store N bits of data or less.

17. The semiconductor device of claim 16, wherein the peripheral circuit region is configured to sequentially apply a first program voltage and a second program voltage to the gate electrode of a selected memory element in a program operation of writing first data to a selected one of the plurality of memory elements, wherein the first program voltage has a different sign than the second program voltage.

18. The semiconductor device of claim 17, wherein the first program voltage has a different magnitude than the second program voltage.

19. The semiconductor device of claim 17, wherein a magnitude of the first program voltage is greater than a magnitude of the second program voltage.

20. The semiconductor device of claim 17, wherein in the first data, at least portions of the N bits of data have different values.

\* \* \* \* \*